US006596547B2

(12) United States Patent
Aggarwal et al.

(10) Patent No.: US 6,596,547 B2
(45) Date of Patent: Jul. 22, 2003

(54) METHODS OF PREVENTING REDUCTION OF IROX DURING PZT FORMATION BY METALORGANIC CHEMICAL VAPOR DEPOSITION OR OTHER PROCESSING

(75) Inventors: Sanjeev Aggarwal, Plano, TX (US); Stephen R. Gilbert, San Francisco, CA (US); Scott R. Summerfelt, Garland, TX (US)

(73) Assignees: Texas Instruments Incorporated, Dallas, TX (US); Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/036,805

(22) Filed: Dec. 21, 2001

(65) Prior Publication Data

US 2003/0119273 A1 Jun. 26, 2003

(51) Int. Cl.$^7$ ................................................ H01L 21/00
(52) U.S. Cl. ............................ 438/3; 438/239; 438/240; 438/253; 438/600; 438/754; 438/396; 257/295; 257/310
(58) Field of Search ............................ 438/3, 239, 240, 438/253, 608, 754, 396; 257/295, 310

(56) References Cited

U.S. PATENT DOCUMENTS 6,261,967 B1 7/2001 Athavale et al.
6,284,654 B1 9/2001 Roeder et al.
6,316,797 B1 11/2001 Van Buskirk et al.

OTHER PUBLICATIONS

"FeRAM Tutorial", Ali Sheikholeslami and P. Glenn Gulak, A survey of circuit innovations in Ferroelectric random–access memories, Proceedings of the IEEE, vol. 88, No. 3, May, 2000, 3 pages, taken from the Internet at http://www.eecg.toronto.edu/–ali/ferro/tutorial.html.

"A survey of Circuit Innovations in Ferroelectric Random Access Memories", Ali Sheikholeslami and P. Glenn Gulak, Proceedings of the IEEE, vol. 88, No. 5, May, 2000, pp. 667–689.

Primary Examiner—Ernest Karlsen
Assistant Examiner—Lisa Kilday
(74) Attorney, Agent, or Firm—Frederick J. Telecky, Jr.; W. James Brady, III

(57) ABSTRACT

A method of fabricating a ferroelectric capacitor is disclosed. The method comprises decreasing a reduction in a bottom electrode material during formation of the ferroelectric dielectric portion of the capacitor. The method comprises forming an oxygen doped iridium layer and forming a ferroelectric dielectric layer thereover. During the formation of the ferroelectric, the oxygen doped iridium layer converts to an iridium oxide layer.

24 Claims, 21 Drawing Sheets

METHODS OF PREVENTING REDUCTION OF IROX DURING PZT FORMATION BY METALORGANIC CHEMICAL VAPOR DEPOSITION OR OTHER PROCESSING

FIELD OF THE INVENTION

The instant invention pertains to semiconductor device fabrication and processing and more specifically to a method of fabricating a ferroelectric memory device.

BACKGROUND OF THE INVENTION

Several trends exist presently in the semiconductor device fabrication industry and the electronics industry. Devices are continuously getting smaller and requiring less power. A reason for these trends is that more personal devices are being fabricated which are relatively small and portable, thereby relying on a small battery as its primary supply source. For example, cellular phones, personal computing devices, and personal sound systems are devices which are in great demand in the consumer market. In addition to being smaller and more portable, personal devices are requiring more computational power and on-chip memory. In light of all these trends, there is a need in the industry to provide a computational device which has memory and logic functions integrated onto the same semiconductor chip. Preferably, this memory will be configured such that if the battery dies, the contents of the memory will be retained. Such a memory device which retains its contents while power is not continuously applied thereto is called a non-volatile memory. Examples of conventional non-volatile memory include: electrically erasable, programmable read only memory ("EEPROM") and FLASH EEPROM.

A ferroelectric memory (FeRAM) is a non-volatile memory which utilizes a ferroelectric material, such as strontium bismuth tantalate (SBT) or lead zirconate titanate (PZT), as a capacitor dielectric situated between a bottom electrode and a top electrode. Both read and write operations are performed for an FeRAM. The memory size and memory architecture affects the read and write access times of an FeRAM. Table 1 illustrates exemplary differences between different memory types.

TABLE 1

| Property | SRAM | Flash | DRAM | FeRAM (Demo) |
|---|---|---|---|---|
| Voltage | >0.5 V | Read >0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F~metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FeRAM is due to the bistable characteristic of the ferroelectric memory cell. An FeRAM cell may be selected by two concurrent X and Y voltage pulses, respectively, wherein X and Y correspond to a specific bit line and word line, respectively, identified by horizontal and vertical decoder circuitry. The FeRAM cells of the capacitor array which receive only one voltage pulse remain unselected while the cell that receives both an X and Y voltage signal flips to its opposite polarization state or remains unchanged, depending upon its initial polarization state, for example.

Two types of ferroelectric memory cells are used commonly, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FeRAM cell 10 includes one transistor 12 and one ferroelectric storage capacitor 14. A bottom electrode of the storage capacitor 14 is connected to a drain terminal 15 of the transistor 12. The 1T/1C cell 10 is read from by applying a signal to the gate 16 of the transistor (word line WL)(e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bitline 18 of the transistor 12 is, therefore, the capacitor charge divided by the bitline capacitance. Since the capacitor charge is dependent upon the bistable polarization state of the ferroelectric material, the bitline potential can have two distinct values. A sense amplifier (not shown) is connected to the bitline 18 and detects the voltage associated with a logic value of either 1 or 0. Frequently the sense amplifier reference voltage is a ferroelectric or non-ferroelectric capacitor connected to another bitline that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. The one difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line ("bitline") 32 and an inverse of the bit line ("bitline-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bitline 32 and a first capacitor 40, and the second transistor 38 couples between the bitline-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bitline 32 and the bar-bar line 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bar-bar line 34, respectively. A differential signal (not shown) is thus generated across the bitline 32 and the bar-bar line 34 by the dual capacitor memory cell 30. The differential signal is sensed by a sense amplifier (not shown) which provides a signal corresponding to the logic level stored in memory.

A memory cell of a ferroelectric memory is limited to a finite number of read and write operations before the memory cell becomes unreliable. The number of operations that can be performed on a FeRAM memory is known as the endurance of a memory. The endurance is an important factor in many applications that require a nonvolatile memory. Other factors such as memory size, memory speed, and power dissipation also play a role in determining if a ferroelectric memory is viable in the memory market.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention relates generally to the fabrication of an FeRAM device that is either a stand-alone device or one which is integrated onto a semiconductor chip that includes many other device types. Several requirements either presently exist or may become requirements for the integration of FeRAM with other device types. One such requirement involves utilizing, as much as possible, the conventional front end and backend processing techniques used for fabricating the various logic and analog devices on the chip to fabricate this chip which will include FeRAM devices. In other words, it is beneficial to utilize as much of the process flow for fabricating these standard logic devices (in addition to I/O devices and potentially analog devices) as possible, so as not to greatly disturb the process flow (thus increase the process cost and complexity) merely to integrate the FeRAM devices onto the chip.

The following discussion is based on the concept of creating the ferroelectric capacitors in an FeRAM process module that occurs between the front end module (defined to end with the formation of tungsten, which has the chemical symbol W, contacts) and backend process module (mostly metallization). Other locations of the FeRAM process module have also been proposed. For example, if the FeRAM process module is placed over the first layer of metallization (Metal-1) then a capacitor over bitline structure can be created with the advantage that a larger capacitor can be created.

Another possible location for the FeRAM process module is near the end of the back-end process flow. One advantage of this approach is that it keeps new contaminants in the FeRAM module (Pb, Bi, Zr, Ir, Ru, or Pt) out of more production tools. This solution is most practical if the equipment used after deposition of the first FeRAM film is dedicated to the fabrication of the FeRAM device structures and, therefore, is not shared. However, this solution may have the drawback of requiring FeRAM process temperatures compatible with standard metallization structures (suggested limitations discussed above). In addition, the interconnection of the FeRAM capacitor to underlying transistors and other needs of metallization may not be compatible with a minimum FeRAM cell size.

The requirements for the other locations will have many of the same concerns but some requirements may be different.

The FeRAM process module is preferably compatible with standard logic and analog device front-end process flows that include, for example, the use of tungsten contacts as the bottom contact of the capacitor. The FeRAM thermal budget is preferably low enough so that it does not impact substantially the front end structures such as the low resistance structures (which includes the tungsten plugs and silicided source/drains and gates) employed in many logic devices. In addition, transistors and other front end devices, such as diodes, may be sensitive to contamination. Contamination from the FeRAM process module, either direct (such as by diffusion in the chip) or indirect (cross contamination through shared equipment), should be addressed so as to avoid transistor and diode degradation. The FeRAM devices and process module should also be compatible with standard backend process flow. Therefore the FeRAM process module should have minimum degradation of logic metallization's resistance and parasitic capacitance between metal and transistor. In addition, the FeRAM devices should not be degraded by the backend process flow with minimal, if any modification. This is a significant challenge since ferroelectric capacitors have been shown to be sensitive to hydrogen degradation and most logic backend process flows utilize hydrogen and/or deuterium in many of the processes (such as in the formation of $SiO_2$ and $Si_3N_4$, CVD tungsten deposition, $SiO_2$ via etch, and forming gas anneals).

Commercial success of FeRAM also advantageously addresses minimization of embedded memory cost. Total memory cost is primarily dependent on cell size, periphery ratio size, impact of yield, and additional process costs associated with memory. In order to have cost advantage per bit compared to standard embedded memories such as embedded DRAM and Flash it is desirable to have FeRAM cell sizes that are similar to those obtained with standard embedded memory technology. Some of the methods discussed in this patent to minimize cell size include making the process flow less sensitive to lithography misalignment, forming the capacitor directly over the contact, and using a single mask for the capacitor stack etch. Some of the methods discussed in this patent, to reduce the added process cost, may require two additional masks for the FeRAM process module and a planar capacitor which reduces the complexity of the needed processes.

Although this patent focuses on using a planar capacitor, a three dimensional capacitor using post or cup structure can be fabricated using many of the same concepts and processes. The planar structure is illustrated because it uses a simpler process and is cheaper to make. The 3D capacitor is preferred when the planar capacitor area needed for minimum charge storage considerations limits the cell size. In this situation, the capacitor area enhancement associated with the 3D configuration allows a smaller planar cell size.

DRAM devices have used this approach for many years in order to reduce cell area.

In accordance with the present invention, a plurality of methods are disclosed which decrease the reduction of an iridium oxide bottom electrode during subsequent formation of a ferroelectric dielectric layer in an FeRAM capacitor. By decreasing reduction of the iridium oxide bottom electrode, fatigue resistance of the FeRAM cell is improved substantially over the prior art. In accordance with one aspect of the present invention, a method of depositing or otherwise forming a bottom electrode in an FeRAM capacitor is disclosed. More particularly, a method of forming a bottom conductive oxide electrode is provided in which an over-oxygenated bottom conductive oxide electrode is initially deposited. Subsequently, during a ferroelectric dielectric material deposition, oxygen loss from the bottom electrode film still occurs, however, the excess oxygen in the conductive oxide film compensates for such loss. Accordingly, after the subsequent processing steps, sufficient oxygen remains within the bottom electrode film to provide the advantageous improved fatigue resistance over conventional pure noble metals electrodes.

In accordance with another aspect of the present invention, a method of addressing a reduction of the iridium oxide bottom electrode during the formation of the ferroelectric dielectric is provided. The method comprises decreasing or eliminating the reduction of iridium oxide by frustrating the oxygen transport mechanism though the iridium oxide during subsequent processing. With regard to this exemplary aspect, a microstructure associated with the iridium oxide portion of the bottom electrode is controlled in order to prevent or reduce an amount of oxygen loss associated therewith. For example, an amorphous iridium oxide layer is employed to frustrate the oxygen transport out of the bottom electrode. Consequently, during subsequent formation of the ferroelectric dielectric layer, although a reducing ambient is still present, oxygen loss from the iridium oxide bottom electrode is reduced substantially, thereby improving the fatigue resistance of the FeRAM capacitor.

According to another exemplary aspect of the present invention, a bottom electrode layer is formed by depositing an iridium layer and then depositing an oxygen doped iridium layer (as opposed to an $IrO_2$ layer) thereover. In the above manner, since the subsequent ferroelectric layer formation does not see an $IrO_2$ layer at its bottom interface, but rather sees an Ir layer, no reduction occurs. However, as the ferroelectric layer process progresses, the oxygen within the oxygen doped Ir layer and the Ir segregate at the ferroelectric layer interface to form an $IrO_2$ layer and thus provide improved fatigue resistance over conventional structures. In addition, since the $IrO_2$ forms during the ferroelectric layer formation, reduction thereof does not occur, thereby resulting in a high quality conductive oxide bottom electrode layer.

According to another aspect of the present invention, a reduction of an iridium oxide bottom electrode layer during subsequent formation of a ferroelectric dielectric layer is substantially reduced by forming a titanium layer over the iridium oxide layer prior to PZT formation. The titanium layer then oxidizes during PZT formation due to the oxygen ambient processing conditions. The titanium oxide substantially retards reduction of oxygen out of the $IrO_2$, thereby substantially maintaining the integrity of the conductive oxide bottom electrode. In addition, the titanium oxide nucleates relatively easy during the subsequent PZT deposition and provides a good microstructure for a high quality PZT film. Lastly, as the PZT formation continues, the titanium oxide assimilates into the PZT film, thereby effectively going away and leaving a high quality PZT film overlying an $IrO_2$ bottom electrode that has not substantially reduced.

According to still another aspect of the present invention, the bottom electrode layer is formed using an $Ir/IrO_2/Ir$ sandwich deposition prior to formation of the ferroelectric dielectric layer. Since oxygen diffusion through iridium is less than through the underlying iridium oxide, a reduction of the iridium oxide is reduced substantially compared to a formation of the ferroelectric dielectric directly over the $IrO_2$. In addition, any oxygen diffusion that does occur causes the iridium layer nearest the ferroelectric dielectric to become oxygen doped. The oxygen therein, in addition to the reducing ambient existing during the ferroelectric dielectric formation process, causes the oxygen doped iridium layer to oxidize during the later portion of the ferroelectric dielectric formation process, thus resulting in an $Ir/IrO_2$ bottom electrode with the ferroelectric dielectric thereover. In the above manner, a conductive oxide bottom electrode portion is provided that experiences less reduction than prior art formation methods, thereby resulting in an FeRAM capacitor exhibiting improved fatigue resistance.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

Similar reference numerals are used throughout the figures to designate like or equivalent features. The figures are not drawn to scale. They are merely provided to illustrate various features associated with the present invention.

DETAILED DESCRIPTION OF THE DRAWINGS

Figure 1:
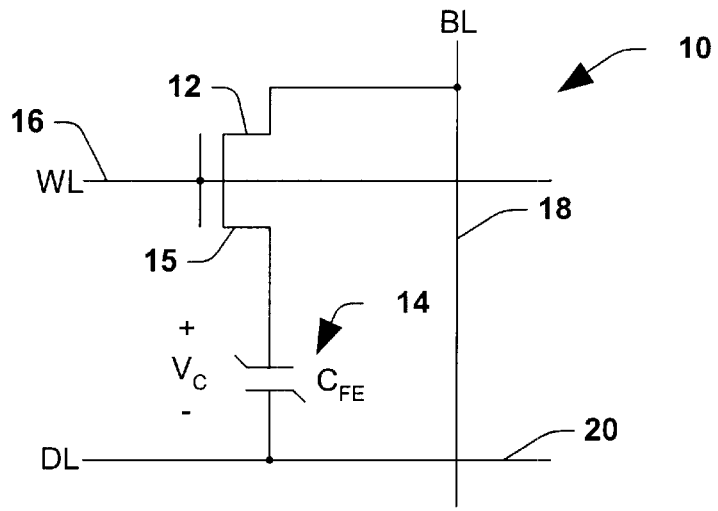
FIG. 1 is a prior art schematic diagram illustrating an exemplary 1T/1C FeRAM memory cell.
Figure 2:
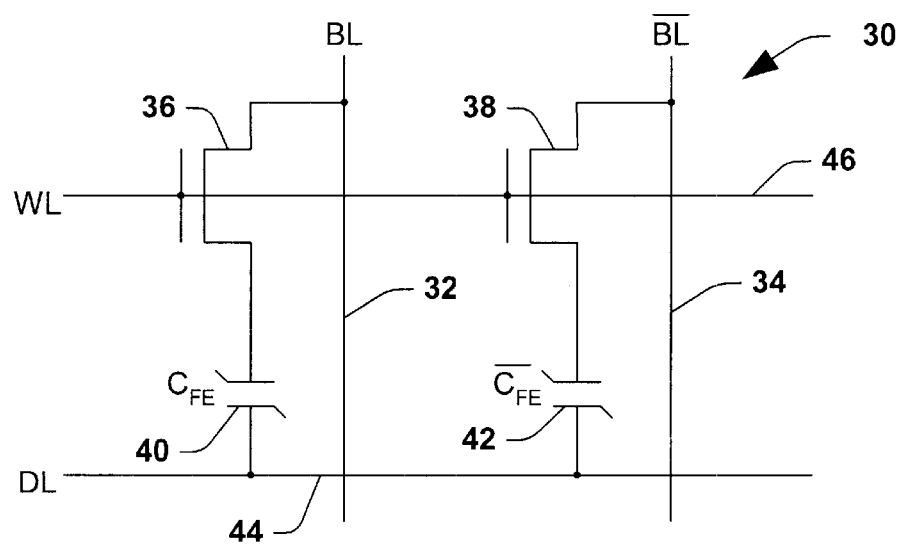
FIG. 2 is a prior schematic diagram illustrating an exemplary 2T/2C FeRAM memory cell.

While the following description of the instant invention revolves around the integration of the FeRAM devices with logic devices and other devices which can be found on a digital signal processor, microprocessor, smart card, microcomputer, microcontroller or system on a chip, the instant invention can be used to fabricate stand-alone FeRAM devices or FeRAM devices integrated into a semiconductor chip which has many other device types. In particular, the improved performance of the FeRAM device of the instant invention compared to standard semiconductor memories appears to make FeRAM the memory of choice for any handheld device which requires low power and large degree of device integration. The figures provided herewith and the accompanying description of the figures are merely provided for illustrative purposes. One of ordinary skill in the art should realize, based on the instant description, other implementations and methods for fabricating the devices and structures illustrated in the figures and in the following description. For example, while shallow trench isolation structures ("STI") are illustrated, any conventional isolation structures may be used, such as field oxidation regions (also known as LOCOS regions) or implanted regions. In addition, while structure 102 is preferably a single-crystal silicon substrate which is doped to be n-type or p-type, structure 102 (FIG. 1) may be formed by fabricating an epitaxial silicon layer on a single-crystal silicon substrate.

In accordance with the present invention, a plurality of methods are disclosed which decrease a reduction of an iridium oxide bottom electrode during a subsequent formation of a ferroelectric dielectric layer in an FeRAM capacitor. By decreasing a reduction of the iridium oxide bottom electrode, a fatigue resistance of the FeRAM cell is improved substantially over the prior art.

Figure 3:
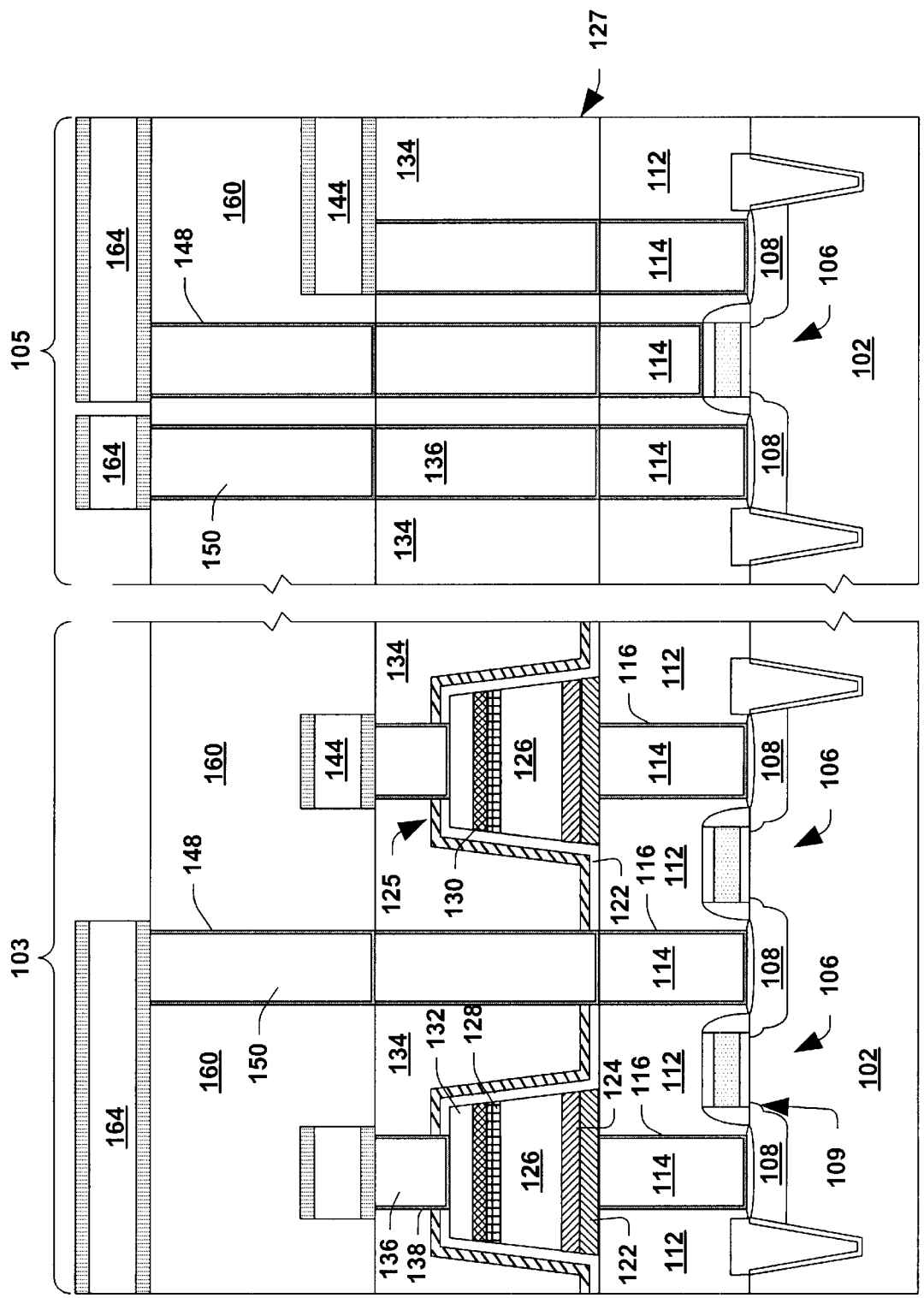
FIG. 3 is a fragmentary cross-sectional view of a partially fabricated device containing FeRAM capacitors and transistors associated therewith fabricated in accordance with one exemplary aspect of the present invention.

Referring initially to FIG. 3, an exemplary, fragmentary cross section of a semiconductor device 100 is provided in which two devices are illustrated. A first device 103 represents a partially fabricated version of am FeRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, gate structures 106 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 106 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

Figure 4:
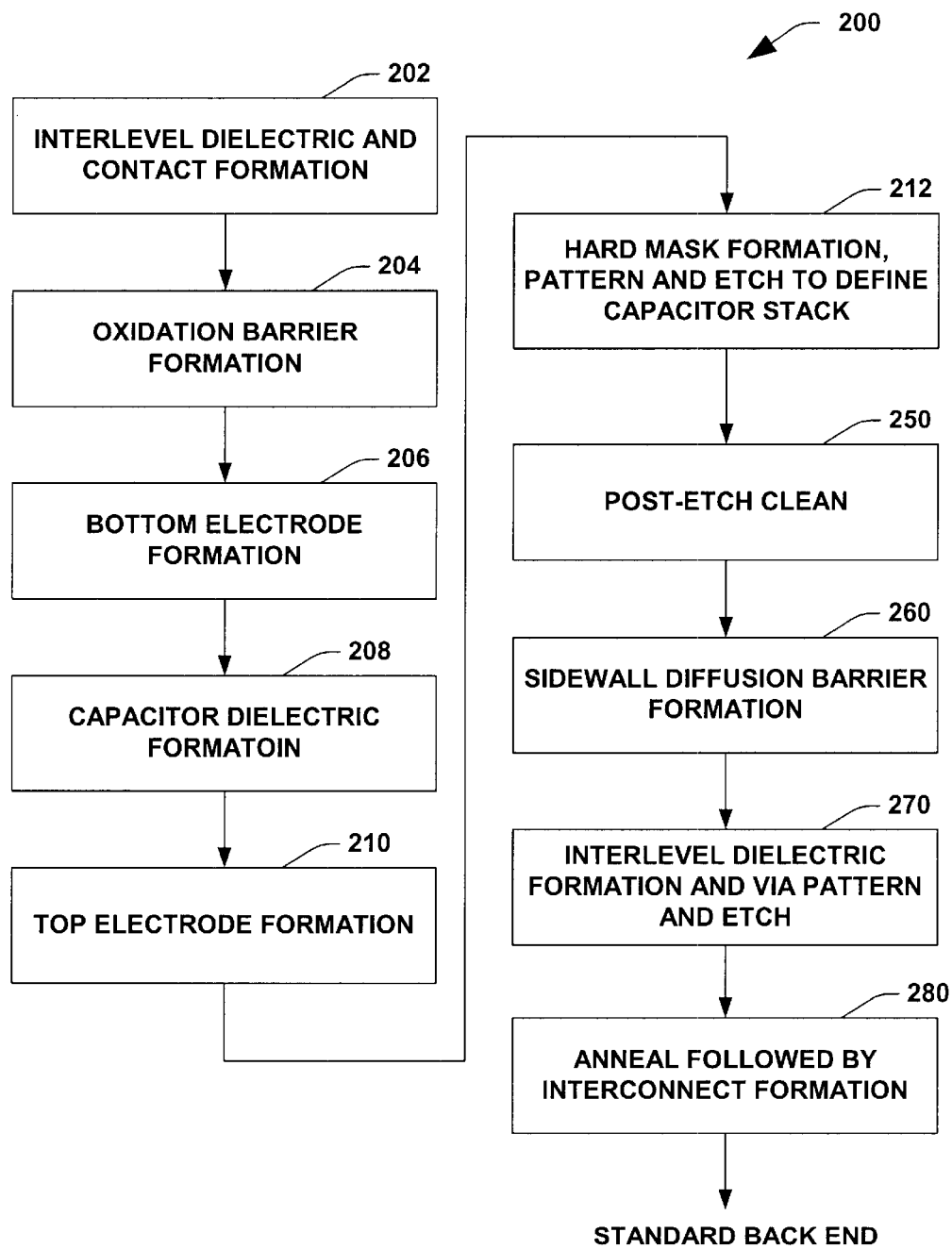
FIG. 4 is a flow chart diagram illustrating a method of forming an FeRAM capacitor in accordance with another exemplary aspect of the present invention.

A dielectric layer 112 is formed over the entire substrate 102 and is patterned and etched so as to form openings for contacts to the substrate and gate structures 106 to be formed (see, e.g., step 202 of FIG. 4). These openings are filled subsequently with one or more conductive materials, such as a plug 114 (for example, comprising a metal such as tungsten, molybdenum, titanium, titanium nitride, tantalum nitride, or a metal silicide such as Ti, Ni or Co, copper or doped polysilicon). A liner/barrier layer 116 may or may not be formed between the plug 114 and dielectric 112. Such a liner/barrier layer 116 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP). In addition, an added diffusion barrier/etch stop (not shown) may be included near the top surface of layer 112 such as $AlO_X$, AlN, $Si_3N_4$, $TiO_2$, $ZrO_2$, or $TaO_X$ that would be deposited after the planarization process. This diffusion barrier is particularly useful if damascene processes are used to create the via or metallization to the contact. The formation of the plug 114 will require etching through this optional barrier/etch stop.

Formation of metal structures which are situated above the contacts is considered to be part of the back end processes. Other than the specific FeRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 112, 134 and 160). If formed, this thin dielectric comprises, for example, silicon nitride, silicon carbide, SiCNO or a silicon oxide (for example, a high-density plasma oxide). In addition, interlevel dielectric layers 112, 134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof. The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148 and liners 142, 146, 162 and 166) comprises, for example, Ti, TiN, W, tungsten nitride, Ta, tantalum nitride, any conventional barrier/liner layer, or any combination or stack thereof). The interlayer dielectric and plug material should be compatible with the FeRAM thermal budget. With existing technology (i.e., one that incorporates a W plug and $SiO_2$ ILD), the FeRAM thermal budget should be less than approximately 600 or 650 C., however, the present invention is not limited thereto. If the ILD is modified to include a low dielectric constant ("low K") layer, the FeRAM thermal budget may need to be reduced further. The preferred interlayer dielectric 112 is therefore a material that can withstand a thermal budget in excess of 600 C., such as silicon oxide (doped and/or undoped), silicon nitride, and/or silicon oxy-nitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of backend process. In particular, this level allows FeRAM devices with capacitor under bitline configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

Initially, a further discussion of FIG. 3 will be provided to appreciate the structure of an FeRAM cell and an exemplary integration position of such a cell within a semiconductor fabrication process. Subsequently, a flow chart and a number of fragmentary cross section diagrams will be provided to illustrate an exemplary process for fabricating such an FeRAM cell in order to provide a context in which the present invention may reside. In conjunction therewith, the present invention will be described and illustrated in greater detail. It should be understood, however, that although the present invention will be shown and described in conjunction with one exemplary context, the invention is applicable to other fabrication methodologies, structures and materials, and such alternatives are contemplated as falling within the scope of the present invention.

An FeRAM capacitor, as illustrated in FIG. 3 at reference numeral 125, resides above the interlayer dielectric 112, and comprises several layers. The FeRAM capacitor 125 of FIG. 3 comprises an electrically conductive barrier layer 122 upon which a conductive bottom capacitor electrode 124 resides (hereinafter, the terms conductive and insulative are employed to indicate electrically conductive and electrically insulative, respectively, unless indicated otherwise). A capacitor dielectric layer 126, a ferroelectric material, is formed over the bottom electrode 124, and is covered by, for example, a conductive multi-layer top electrode 128, 130. A top portion of the FeRAM capacitor 125 comprises a hard mask layer 132 which, as will be discussed in greater detail later, may be employed to facilitate the capacitor stack etch. The capacitor stack is then covered by a multi-layer sidewall diffusion barrier 118, 120.

Figure 5A:
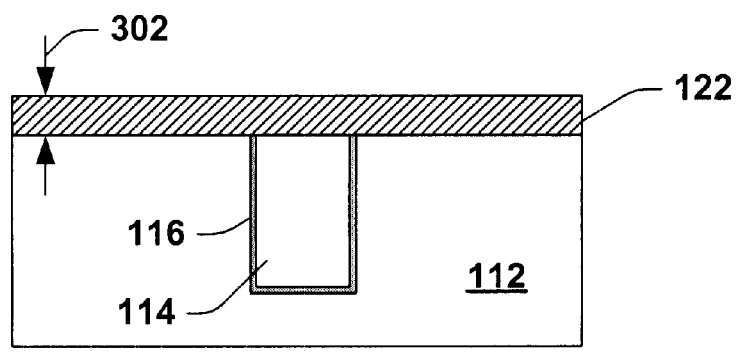
FIGS. 5a–5k are fragmentary cross-sectional views illustrating various steps of forming an FeRAM cell in accordance with yet another exemplary aspect of the present invention.

An exemplary method of forming an FeRAM capacitor in accordance with the present invention which is similar in many respects to the capacitor 125 of FIG. 3 will now be discussed in conjunction with FIGS. 4 and 5a–5k, respectively. As stated above, conductive diffusion and/or oxidation barrier layer 122 may or may not be formed depending on whether the plug 114 needs to be protected during subsequent processing, for example, of the capacitor dielectric. If formed at step 204 of FIG. 4, as illustrated in FIG. 5a, the conductive barrier layer 122 comprises, for example, TiAlN or other possible barriers (some of which have a slow oxidation rate compared to TiN) which include: TaSiN, TiSiN, TiN, TaN, HfN, ZrN, HfAlN, CrN, TaAlN, CrAlN, or any other conductive material. A thickness 302 of this layer is, preferably, on the order of 60 nm (for a 0.18 um via). In the future, scaling the via size will allow scaling of the barrier thickness as well. One exemplary deposition technique for the barrier layer is a reactive sputter deposition using $Ar+N_2$ or $Ar+NH_3$. It should be noted that Ar is a standard inert gas used for sputter deposition or physical etching based on cost and performance. It is possible to use other inert gases instead of Ar for these applications throughout the process described in this document. Other deposition techniques that might be used include, for example, chemical vapor deposition (CVD) or plasma enhanced CVD (PECVD).

Figure 5B:
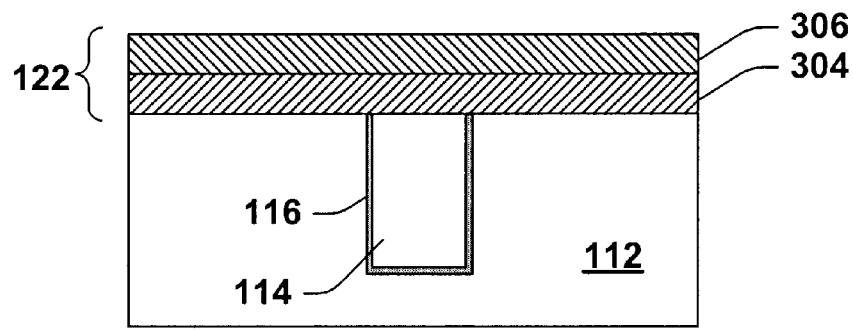

CVD of nitrides actually results in carbo-oxy-nitrides especially when metalorganic precursors are used and this is also acceptable in many cases. For the preferred W contact it is preferred to deposit a bilayer diffusion barrier, as illustrated in FIG. 5b. First, a CVD TiN layer 304 (for example, about 40 nm thick) is deposited followed by a PVD TiAlN layer 306 (for example, about 30 nm thick). Even more preferred would be CVD or PECVD deposition of TiAlN (~60 nm thick). The preferred proportion of aluminum in TiAlN is around 30% or more and about 60% or less Al and about 40% or more and about 50% or less is more preferred in order to have improved oxidation resistance. A better diffusion barrier will, in general, allow the oxygen stable bottom electrode material (to be formed later) to be thinner or permit a higher process temperature to be used.

Figure 5C:
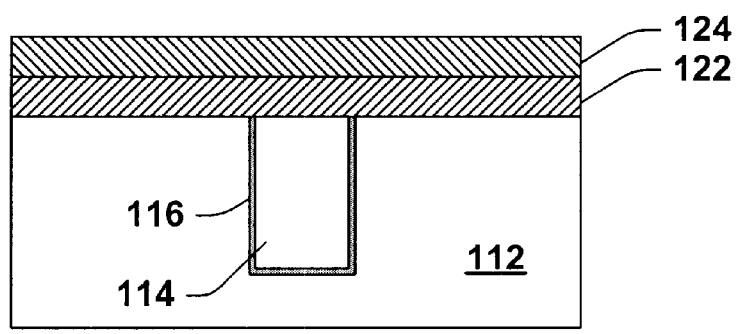

The bottom electrode 124 of the capacitor is formed at step 206 of FIG. 4 either on the barrier layer 122 or directly on the interlevel dielectric layer 112 so as to make electrical connection with the underlying contact structure, as illustrated in FIG. 5c. Preferably, the bottom electrode 124 is around 25 nm thick or more and about 100 nm thick or less, is stable in oxygen, and is comprised of a noble metal or conductive oxide, for example, iridium, iridium oxide, Pt, Pd, PdOx, Au, Ru, $RuO_x$, Rh, $RhO_x$, $LaSrCoO_3$, (Ba,Sr) $RuO_3$, $LaNiO_3$ or any stack or combination thereof. For any electrode using noble metals, it is advantageous, from a cost and ease of integration standpoint, to use layers which are as thin as possible. A desirable bottom electrode for a PZT capacitor dielectric is either about a 50 nm thick Ir or a stack comprised of about 30 nm thick IrOx and about 20 nm thick Ir, which is formed, for example, by sputter deposition for Ir (Ar) and/or reactive sputter deposition ($Ar+O_2$) for IrOx. Lower ferroelectric deposition temperatures might allow even thinner electrodes, which may be desired. Another alternative deposition technique comprises chemical vapor deposition.

In order to control the stress of the bottom electrode, a post formation bottom electrode anneal may be performed for stress relaxation and/or to improve the microstructure/stability of the bottom electrode. Exemplary anneal conditions are about 400 C. or more and about 600 C. or less for about 2 min or more and about 10 min or less in an oxygen or an inert gas mixture. This anneal may be performed at any time after the formation of the bottom electrode, but preferably prior to the formation of the ILD 160.

Figure 5D:
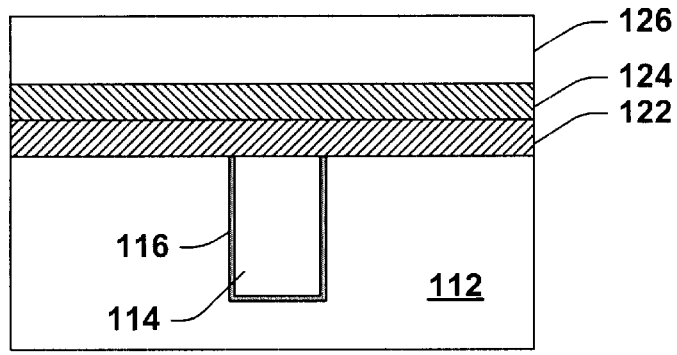

The capacitor ferroelectric dielectric layer 126 is formed at step 208 of FIG. 4 over the bottom electrode layer 124, for example, as illustrated in FIG. 5d. Preferably, the ferroelectric dielectric 126 is less than about 150 nm thick (more preferably less than about 100 nm thick, and most preferably less than about 50 nm thick) and comprises of a ferroelectric material, such as $Pb(Zr,Ti)O_3$ (PZT—lead zirconate titanate); doped PZT with donors (Nb, La, Ta), acceptors (Mn, Co, Fe, Ni, Al), and/or both; PZT doped and alloyed with $SrTiO_3$, $BaTiO_3$ or $CaTiO_3$; strontium bismuth tantalate (SBT) and other layered perovskites such as strontium bismuth niobate tantalate (SBNT); or bismuth titanate; $BaTiO_3$; $PbTiO_3$; or $Bi2TiO_3$.

PZT is a desirable choice for the ferroelectric dielectric 126 because it has the highest polarization and the lowest processing temperature of the aforementioned materials. In addition, an exemplary Zr/Ti composition is around 20/80, respectively, in order to obtain good ferroelectric switching properties (for example, large switched polarization and relatively square-looking hysterisis loops). Alternatively, Zr/Ti compositions of approximately 65/35 may be employed to maximize uniformity in capacitor properties. Further, it is advantageous to have donor doped PZT with roughly about 0.05 to about 1% donor dopant because the donor dopant improves the reliability of the PZT by helping to control the point defect concentrations.

One exemplary and desirable deposition technique for these dielectrics is metal organic chemical vapor deposition (MOCVD). MOCVD is advantageous especially for thin films (for example, films less than about 100 nm thick). Thin PZT is extremely advantageous in making integration more simple (less material to etch), less expensive (less material to deposit and therefore less precursor) and allows lower voltage operation (lower coercive voltage for roughly the same coercive electric field). The capacitor dielectric 126 may be deposited in either a crystalline/poly-crystalline state or it can be deposited in an amorphous phase at low temperatures and then crystallized using a post-deposition anneal, which is commonly employed for Bi ferroelectric films. The post deposition crystallization anneal can be performed immediately after deposition or after later process steps such as electrode deposition or post capacitor etch anneal. The preferred MOCVD PZT approach results in a poly-crystalline film deposited at temperatures preferably between about 450 C. or more and about 600 C. or less (more preferred between about 500 and about 550 C.).

Alternatively, the dielectric layer 126 may be formed using a chemical solution deposition (for example, sol-gel or metal organic decomposition). In addition, one exemplary Zr/Ti composition is around 20/80 to obtain good ferroelectric switching properties (for example, large switched polarization and relatively square looking hysteresis loop). Alternatively, a Zr/Ti composition of around 65/35 may be employed in order to minimize switched polarization and uniformity in capacitor properties. Additionally, it may be desirable to have donor doped PZT with roughly 0.5 to 1% donor dopant. The donor dopant improves the reliability of the PZT by helping to control the point defect concentrations. The MOCVD process conditions, if employed, are desirably preformed at a temperature less than around 600 C. (even more preferred to be less than 550 C.). The deposition rate of the PZT is set to be between 100 and 200 nm/min. In order to have reproducible control of film composition, the MOCVD process may use two or even one cocktail of metalorganic precursors mixed together with a solvent to keep it a liquid. The MOCVD reactor is designed to vaporize the liquids with either one or two vaporizers and precisely control the reactor wall temperatures to prevent the precursors from either decomposing or condensing. An Ar or He carrier gas is, preferably, used to flow the precursors to the reactor chamber or showerhead where they are mixed with an oxidizer ($O_2$, $N_2O$, or $H_2O$, with $O_2$ preferred).

Figure 5E:
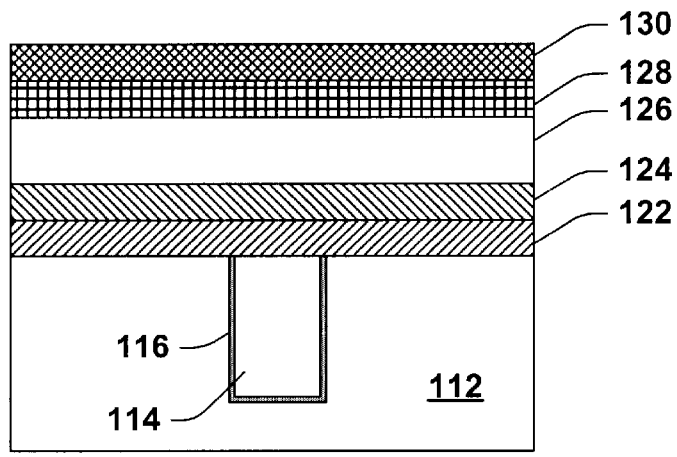
Figure 5F:
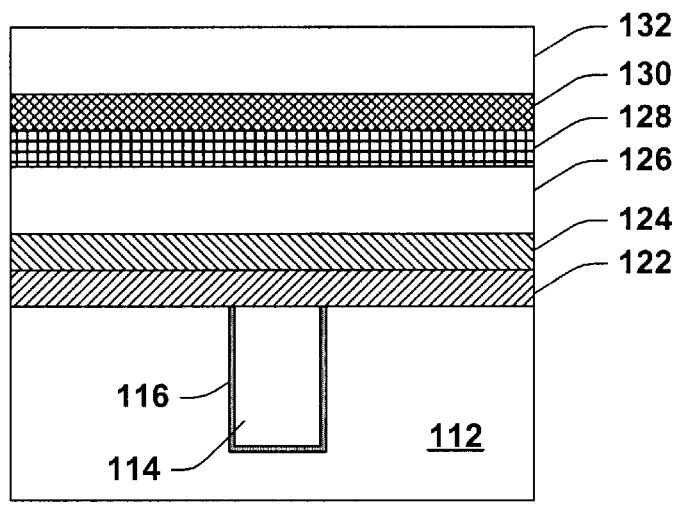

The top electrode layer(s) 128, 130 is formed at step 210 of FIG. 4 on the capacitor dielectric layer 126, for example, as illustrated in FIG. 5e. In this exemplary aspect of the present invention, the top electrode is a multi-layer 128, 130; however, the top electrode can be implemented in just one layer. In one example, the first layer 128 comprises iridium oxide (for example, less than about 100 nm thick and more preferably less than about 50 nm thick), and the second layer 130 comprised iridium (for example, less than about 100 nm thick and more preferably less than about 50 nm thick). In particular, it is advantageous for Pb based ferroelectrics to have a conductive oxide top electrode such as $IrO_x$, $RuO_x$, $RhO_x$, $PdO_x$, $PtO_x$, $AgO_x$, $(Ba,Sr)RuO_3$, $LaSrCoO_{3,}$ $_{LaNiO3}$, $YBa_2Cu_3O_{7-x}$ rather than a pure noble metal so as to minimize degradation due to many opposite state write/read operations (fatigue). Many of the Bi-containing ferroelectrics, such as SBT, can also use noble metal electrodes such as Pt, Pd, Au, Ag, Ir, Rh, and Ru and still retain good fatigue characteristics.

If the top electrode 128, 130 is an oxide, it is advantageous to have a noble metal layer above it in order to maintain low contact resistance between the top metal contact and oxide. For example, it is possible that a TiN layer in contact with IrOx might form $TiO_2$, which is thermally insulating, during subsequent thermal processes. For any electrode using a noble metal such as Pt, Ru, Pd, or Ir, it is advantageous, from a cost and integration standpoint, to use as thin a layer as possible. For PZT electrodes, the preferred top electrode stack 128, 130 is comprised of approximately 10 nm Ir deposited by PVD in Ar on approximately 20 nm IrOx deposited by reactive PVD in $Ar+O_2$ on top of the PZT capacitor dielectric. IrOx is preferred to be deposited below about 400 C. in gas mixtures of between about 50% and about 80% $O_2$ with the rest oxygen with a relatively low sputter power and hence a slow deposition rate (for example, less than about 20 nm/min).

It is possible to anneal the top electrode prior to deposition of a hard mask in order to control the stress in the top electrode 128, 130. For example, sputter deposited electrodes will typically be subject to compressive stress while, the stress in annealed electrode will be tensile.

If multiple layers or all of the layers are etched simultaneously, then a hard mask layer 132 may be formed at step 212 of FIG. 4 over the layers, as illustrated in FIG. 6f. Preferably, the hard mask 132 is comprised of a material which is thick enough so as to retain its integrity during subsequent etch processing. The hard mask may be, for example, around 50 to 500 nm thick (more preferably around 100 to 300 nm thick—most preferably around 200 nm thick) and, for example, comprises TiAlN, TiN, Ti, $TiO_2$, Al, AlOx, AlN, TiAl, TiAlOx, Ta, TaOx, TaN, Cr, CrN, CrOx, Zr, ZrOx, ZrN, Hf, HfN, HfOx, silicon oxide, low-k dielectric, or any stack or combination thereof. An example of a hard mask stack is 300 nm of PECVD deposited $SiO_2$ on 50 nm of sputter deposited TiAlN or TiN.

The hard mask thickness is controlled by the subsequent etch processing and the relative etch rates of the various materials, the thicknesses of the etched layers, the amount of overetch required, and the desired remaining hard mask thickness after etching all of the layers. Thinner layers result in thinner hard masks. The hard mask may or may not be removed after the etching of the capacitor stack. If hard mask 132 is not removed, as illustrated in FIG. 3, then it is preferable to form the hard mask of a conductive material. However, a non-conductive or semiconductive material may be used, but the interconnection to the top electrode of the capacitor should preferably be formed through this hard mask (not shown) so as to make direct connection to the top electrode.

The deposition of the hard mask may be a single or multi-layer stack of different materials in order to better control the hard mask profile and remaining hard mask thickness. The preferred deposition process for metal nitride hard masks is sputter deposition using $Ar+N_2$ gas mixtures. One exemplary deposition process for silicon oxide containing hardmasks is TEOS PECVD.

In another example, a hard mask stack is 30 nm of TiAlN on 120 nm of TiAl, which is formed on 20 nm TiAlO which is formed on 50 nm of TiAlN. All of these layers are, for example, deposited by sputter deposition in the same chamber where the film composition is changed during the deposition by varying the gas composition ($Ar+N_2$ (50/50) for nitride, Ar for metal, and $Ar+O_2$ (90/10) or $Ar+N_2+O_2$ (85/10/5) for oxide). The TiAlN is, for example, deposited at around 400 C. with high power to achieve roughly 100 nm/min TiAlN deposition rate. The TiAlN can be replaced by TiN for all of these cases.

After the contact formation, several different deposition steps have been described. In particular, bottom diffusion barrier (step 204), bottom electrode (step 206), ferroelectric (step 208), top electrode (step 210) and hard mask (step 212). It is likely that all or nearly all of the pieces of equipment used in these process steps will be considered potentially contaminated by ferroelectric elements. Therefore these pieces of equipment generally will be dedicated. The wafers will most likely have a significant, if not a high, contamination level on the backside of the wafers. The next process step after hardmask deposition is typically lithography. It is likely that processing wafers with backside contamination through this tool will contaminate the tool and hence result in contamination of clean wafers processed through this tool with FeRAM contaminates on their backside. Therefore, it is preferred to clean the backsides of the FeRAM wafers so as to be able to share the lithography equipment and allow clean wafers to be processed through the lithography equipment without any FeRAM contamination.

If the hard mask 132 includes standard materials such as $SiO_2$ then the backside of the wafers might be cleaned prior to deposition of this later part of the hardmask. For example, if the hardmask is comprised of $SiO_2$ on TiAlN then it is preferred to clean the backside of the wafer after the TiAlN deposition process and before the $SiO_2$ deposition process. This will prevent the $SiO_2$ deposition tool from being contaminated, and, hence, allow it to be shared.

The cleaning process depends on the backside contamination elements and their contamination levels. Assuming the preferred approach (PVD barrier, hardmask, bottom electrode, top electrode and MOCVD PZT), there will be low levels of Ir on the backside, but continuous films thereof assuming the MOCVD process does not have edge exclusion. Therefore for this type of wafer contamination the preferred backside wafer clean process is a wet etch process that etches the back, edges and small region on the frontside of the wafer near the edge. The etch process is somewhat dependent on the materials present on the backside of the wafer (for example if it is Si, $SiO_2$ or $Si_3N_4$). Wet etching PZT preferably is accomplished using either a strong fluorine acid or an acid mixture with chlorine and fluorine etch chemistries, such as $H_2O+HF+HCl$ or $H_2O+NH_3F+HCl$.

Figure 5G:
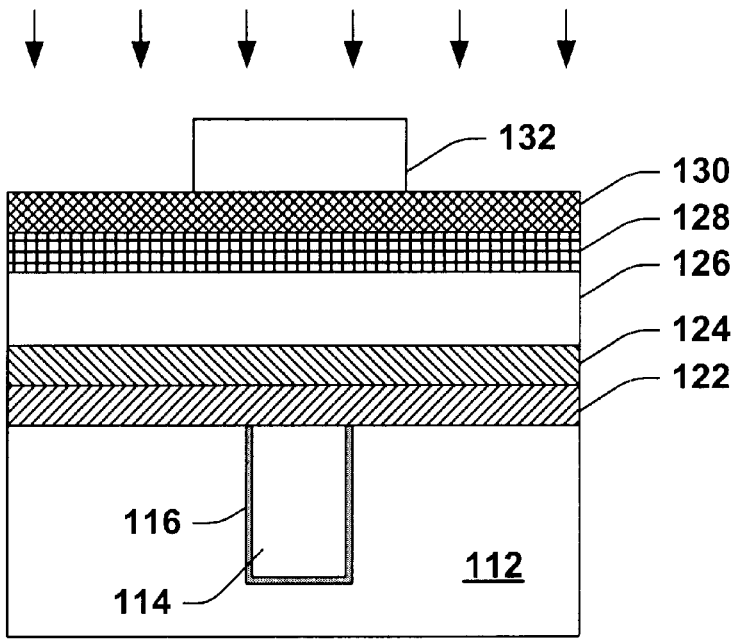
Figure 5H:
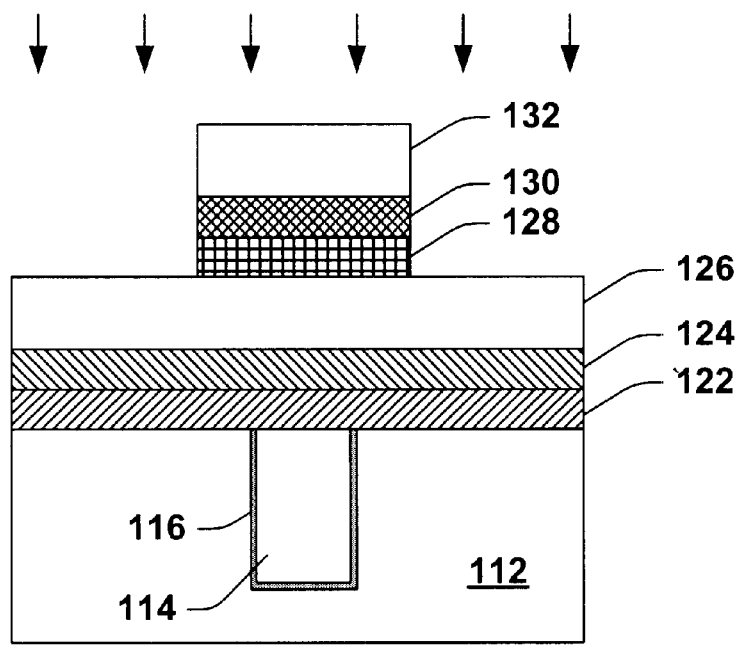
Figure 5I:
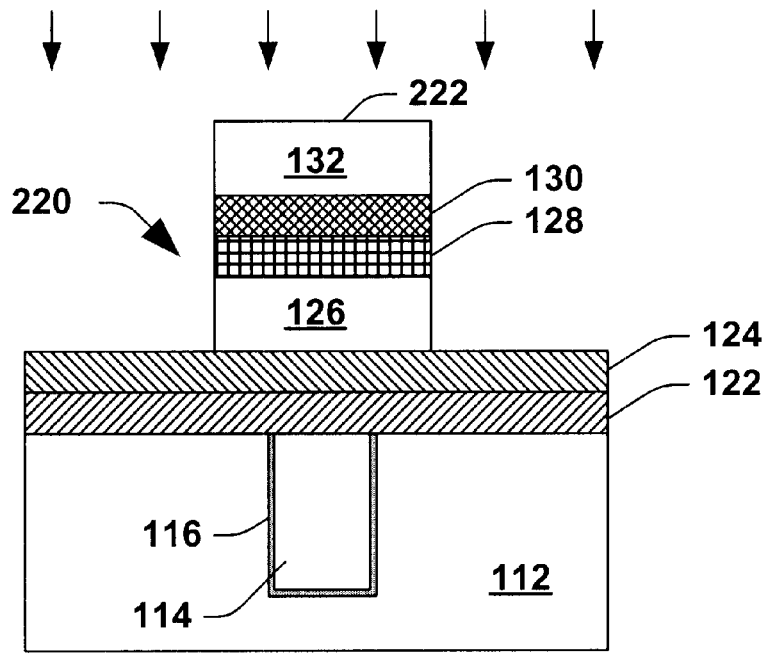

As illustrated in FIG. 5g, the hard mask 132 is patterned (at step 212 of FIG. 4) followed by multiple etch steps in FIGS. 5h–5i using the patterned hard mask to define a capacitor stack structure 220. The formation of the capacitor stack structure is further illustrated in FIG. 5h, wherein a patterning of the top electrode 128, 130, is performed at 216 via, for example, etching. Subsequently, the ferroelectric dielectric layer 126 is also patterned at 218 via, for example, etching, as illustrated in FIG. 5i. Note that in FIG. 5i, the patterning of the top electrode layer 128, 130 and the dielectric layer 126 results in a capacitor stack structure 220 (which may include the hard mask 132). Note that in FIG. 5i, the patterning of the capacitor stack structure 220 appears to result in nearly vertical sidewalls 224, however, FIG. 5i is provided merely for ease of explanation, and it should be understood that the sidewalls 224 of the capacitor stack structure 220 are typically sloped slightly based on the anisotropy of the patterning process employed, as illustrated, for example, in FIG. 5j.

Etching both layers with the same hard mask is not only cheaper but also allows the cell size to be smaller by eliminating misalignment tolerances which are necessary if more than one lithography step is used. As mentioned before, the preferred approach is to use the hard mask 132 with multiple etch processes. This etch process can be modified by using elevated temperatures in order to achieve even steeper sidewall slopes and, therefore, less critical dimension (CD) growth. In general, it is preferred to minimize CD growth and this can be achieved by having a steeper etch profile and/or by having thinner layers. The low temperature etch process of one embodiment of the instant invention which utilizes a hard mask achieves sidewall slopes of roughly 74 degrees for the PZT and Ir structures, while the TiAlN structure profile is steeper. The etch rate of Ir and PZT (slow etch rate materials) is roughly 100 nm/min.

For example, an etch process for the top electrode layer (and also the bottom electrode layer 124 which will follow after the formation of a protective sidewall) may be a $Cl_2+O_2$ or a $Cl_2+CO$ etch chemistry with either $N_2$ or Ar as potential additives. Preferably, $Cl_2+O_2$ is employed with $N_2$ added. For a Ti containing hard mask, the $O_2$ is preferably >5–10%. In addition, the etch may occur in a high density plasma (e.g., 1200 W) with an intermediate substrate bias (e.g., 300 W on chuck), at an intermediate pressure (e.g., 10 mTorr), and at a relatively high temperature (e.g., 350–400 C.).

In accordance with another example, the hard mask and top electrode are etched as follows. The etch approach uses one high-density plasma etch chamber to etch all the hard mask, top electrode layer, and dielectric layer using a process sequence in the same chamber. In each case the remote plasma density is set to near maximum power. The hard mask is first etched using chlorine chemistries (unless a $SiO_2$ hard mask is used, in which case a fluorine and chlorine chemistries are used). An exemplary TiAlN etch recipe comprises a $Cl_2$ and $N_2$ (80/20) etchant with a pressure around 10 mTorr and medium substrate bias. If TiAlOx is part of the hard mask then a short high power step may be added so as to break through this layer. After etching the hard mask, the resist is removed using $O_2$ and $N_2$ (85/15) at a pressure around 40 mTorr and a small substrate bias. The Ir/IrOx top electrode is, for example, etched using a $Cl_2+N_2+O_2$ chemistry (60/20/20) at high bias (around 100 nm/min etch rate) at lower pressures (around 3 mTorr). The oxygen is added to insure a high selectivity between the Ir etch and the TiAlN hard mask etch.

Yet another exemplary patterning approach uses a high temperature etch process to etch low volatility species near room temperature such as Ir, IrOx and PZT. The process sequence is therefore listed below. For an $SiO_2$ hard mask, the $SiO_2$ is first etched in a dedicated $SiO_2$ etch chamber (fluorine chemistries only) using standard $SiO_2$ etch chemistry. The resist is then removed using standard ash process (such as $O_2+N_2+H_2O$+optional $CF_4$). The TiAlN (underneath the $SiO_2$) will be etched in the high temperature etch chamber prior to the Ir preferably using similar chemistries and powers as discussed before but with a higher pressure (15–20 mTorr). For a TiAlN hard mask, a near room temperature etch chamber is used with process conditions similar to those discussed above. The resist can be removed in that chamber or in a dedicated chamber as well. The Ir/IrOx top electrode, PZT, IrOx/Ir bottom electrode and TiAlN bottom electrode diffusion barriers will be etched at high temperature using etch recipes similar to that discussed at room temperatures except the chamber pressure will be between 10–20 mTorr.

Figure 5J:
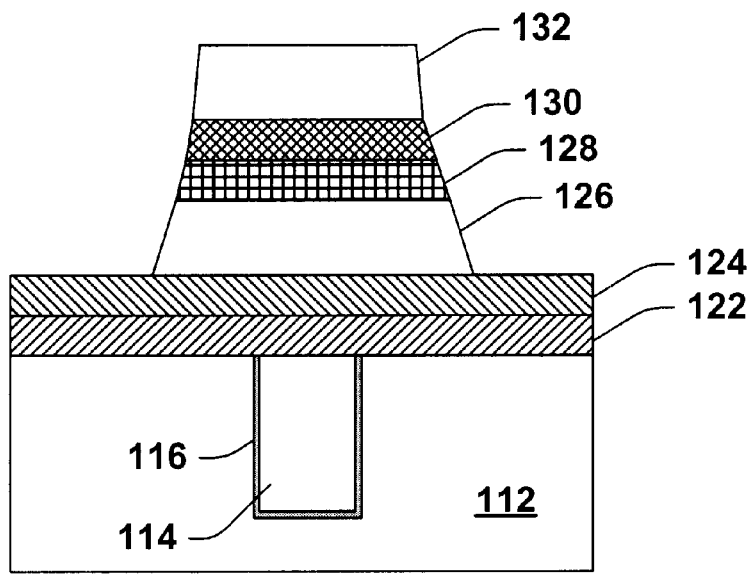

In addition, an exemplary etch process for the ferroelectric dielectric layer 126 will depend upon the type of ferroelectric material employed. For example, for a PZT material, an etch chemistry may include $Cl_2$ plus fluorine gas plus an oxidizer (e.g., $O_2$ or CO). For example, $Cl_2+O_2+CH_2F_2$ may be employed in a high density plasma (e.g., 1200 W) at an intermediate pressure (e.g., 10 mTorr), at a substrate bias of about 450 W RF on chuck, at a temperature of about 350–400 C. Alternatively, a $BCl_3$ chemistry with Ar may be implemented. Note that in FIGS. 5g–5i, the capacitor stack etch is illustrated is purely anisotropic for simplicity. However, the actual etch will not have vertical sidewalls, but rather will exhibit sloped sidewalls, as illustrated in FIG. 5j.

Alternatively, if PZT is the dielectric employed, the PZT may be etched in a reactive chemistry containing chlorine and fluorine (for example $Cl_2+CF_4+N_2+O_2$ (45/15/20/20)) at intermediate pressures (around 10 mTorr) and a high substrate bias (around 100 nm/min etch rate). Again, the oxygen is added to insure good selectivity between PZT etch rate and hard mask etch rate and also to minimize oxygen loss from the PZT.

The etch process is a relatively dirty process and hence it is likely that the etch tool and the frontside, edge and backside of the wafers will have FeRAM contamination or have etch residues with FeRAM contamination. It is, therefore, necessary to clean the frontside of the wafer and chemically remove etch residues and possibly remove a thin layer of damaged PZT. This post-capacitor-etch wet-clean may, with some etch conditions and chemistries, be as simple as a deionized water (DI water or DIW) clean (tank soak with or without megasonic followed by a spin rinse dry) or the tank etch might be acid-based in order to improve the clean or remove more damage. The etch process can also result in redeposition of conductive material such as noble metals on the sidewall. For example, with Ir bottom electrodes it is possible to redeposit Ir on the sidewalls of the PZT which would result in unacceptably high leakage current for the capacitor. The wet clean (step 250 of FIG. 4) can be used to also remove this unwanted material using chemistries that etch a little of the ferroelectric material and also will keep the unwanted material in solution. The backside and edges of the wafer are likely to be significantly contaminated by redeposition of FeRAM elements. They should be removed prior to processing in a shared tool.

The capacitor etch of step 214 of FIG. 4 results in damage or degradation of the ferroelectric which needs to be recovered. One method to recover this damage is by $O_2$ plasma exposure (to recover any oxygen loss that might have occurred) and/or a RTA or furnace anneal in an inert or oxidizing atmosphere (to add oxygen and to improve the crystallinity of the damaged surfaces created by the etch process. For PZT this anneal is preferably performed around 500–650 C. (for a furnace anneal the duration is preferably around 15 min to 2 hr) or 550–700 C. (for a RTA the duration is preferably around 10 sec to 60 sec).

Figure 5K:
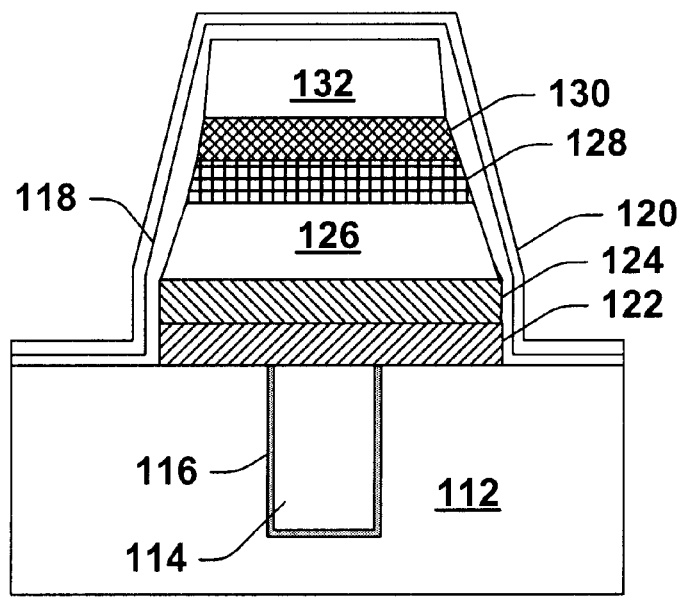

The sidewalls of the resulting capacitor typically will be fairly steep. A sidewall diffusion barrier 118, 120 is, preferably, formed at step 260 of FIG. 4 on the capacitor stack prior to the formation of layer 134 and the etching of the interconnection holes, as illustrated in FIG. 5k. The sidewall diffusion barrier 118, 120 is advantageous because it allows for the misalignment of the interconnect without shorting out the capacitor, it protects the capacitor from the diffusion of most substances into the capacitor, and it protects the rest of the structures from the out-diffusion of substances from the capacitor.

In one exemplary aspect of the present invention, the sidewall diffusion barrier is illustrated as two layers (layers 118 and 120), but the sidewall diffusion barrier may be comprised of more or fewer layers. In one example, the layer 118 is around 30 nm thick and comprises $AlO_x$, $Ta_2O_5$, AlN, $TiO_2$, $ZrO_2$, $HfO_2$, or any stack or combination thereof; and layer 120 is around 30 nm thick and comprises silicon nitride, AlN, or any stack or combination thereof. One exemplary process for depositing the metal oxides or nitrides (which can also be carbo-oxy-nitrides especially when metalorganic precursors are used) is MOCVD under conditions with minimal free hydrogen (i.e., enough oxygen such that $H_2O$ is formed rather than $H_2$). It is also possible to use plasma enhanced CVD or MOCVD process.

Alternatively, reactive sputter deposition can be used with either $Ar+O_2$ (for oxides), $Ar+N_2$ (for nitrides) or $Ar+O_2+N_2$ (for oxy-nitrides). One exemplary process for silicon nitride is CVD or PECVD. For a low hydrogen process, the process gases should be $SiH_4$ and $N_2$, where the flow rate of $N_2$ is much greater than that of SiH$_4$. For a hydrogen free PECVD Si$_3$N$_4$ deposition process, then SiCl$_4$+N$_2$ should be used and, again, it is beneficial to have a flow rate of N$_2$ which is much greater than that of SiCl$_4$. For the example listed here, the AlOx layer is used as a Pb and H diffusion barrier while the Si$_3$N$_4$ layer is used as a contact etch stop.

If a subsequent via etch can be modified so that it stops on the sidewall layer (AlOx, for example) then the one layer performs as an etch stop and an additional layer (i.e. Si3N4) is not necessary. In this case, the thickness of the sidewall might need to be increased.

An alternative approach is to etch back the sidewall material after deposition. This etchback can be done after deposition of the diffusion barrier layer(s). In one preferred embodiment AlOx (approximately 40 nm is preferred) is deposited followed by an etchback using chlorine containing etch gas (BCl$_3$ or Cl$_2$ for example) followed by PECVD deposition of Si$_3$N$_4$ (approximately 30 nm is preferred).

If the etch damage has not yet been healed by an anneal, then the anneal can be performed after the sidewall diffusion barrier deposition. For PZT this anneal is, preferably, performed around 500–650 C. (for a furnace anneal for around 15 min to 2 hr) or 550–700 C. (for a RTA for around 10 sec to 60 sec). Even more preferred is a RTA at 650 C. for 1 min. This option is desirable if the choice of interlayer dielectric layer that is formed directly above the ferroelectric capacitor is a low-K material with a maximum thermal budget of less than around 500 C. This anneal can be performed in an oxidizing or inert atmosphere conditions.

At the beginning of the AlOx deposition process, the front side of the wafer has exposed FeRAM elements. The AlOx deposition process may or may not result in contamination of the tool (defined to be additional FeRAM contaminants on subsequent wafers at levels above care-about-level, which is around $10^{10}$ atoms/cm$^2$). If the AlOx deposition process on FeRAM wafers does not result in contamination then it is preferred to wet clean the backside of the wafer prior to depositing this sidewall diffusion barrier. If the AlOx deposition process on FeRAM wafers does result in tool contamination then the preferred backside clean can be done after this step. The wet chemistry used to clean the backside of the wafer might be different from that used the first time since the contamination of the backside is expected to have different elemental concentration levels.

Above the sidewall diffusion barrier an interlayer dielectric(s) are deposited (at step 270 of FIG. 4). A thin dielectric layer (not shown) may be formed between each of the interlevel dielectric layers (layers 112, 134 and 160). If formed, this thin layer is, for example, a silicon nitride, silicon carbide, (SiCNO) or an siliconoxide (preferably a high-density plasma oxide). In addition, interlevel dielectric layers 112, 134, and 160 comprise, for example, an oxide, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The thermal budget of the first and second ILDs (112/134) will impact FeRAM module process details. After the deposition of the second interlayer dielectric (134) the preferred process is to planarize the dielectric preferably using CMP in order to make the surface flat for subsequent lithography process. Depending on the choice of back-end metallization there are multiple processing options. For etched Al metallization, the primary option is for Al or W vias. For damascene metallization (Al or Cu is preferable) there is the choice of dual damascene (via and metal filled at same time) or separate metal vias (Al, Cu or W) filled prior to single damascene metal. All of the process routes using vias and etched metal or single damascene metal (referred to as via first) are more similar with regards to FeRAM process details compared to dual damascene approach.

An exemplary process flow for via first is as follows. Depending on the metallization scheme such as Cu, a diffusion barrier/etch stop (typically silicon carbide, silicon nitride, silicon oxygen nitride, silicon carbo-oxy-nitride) will be deposited on the ILD. Lithography will then be used to form a patterned resist. The contact etch process will then etch through following stack: antireflection coating (if present), etch stop (if present), ILD, then sidewall diffusion barrier(s) which overlie the capacitor. It is likely that a different etch process (chemistry and plasma condition) will be used for each different material (not because the via depth is less above the contacts compared to in the periphery). In the preferred embodiment where the sidewall diffusion barrier is comprised of Si$_3$N$_4$ on AlOx, the Si$_3$N$_4$ can act as an etch stop for the ILD etch. This is a standard etch for applications like gate etch where there is a height difference in the ILD thickness between various etched regions. After the ILD etch, the Si$_3$N$_4$ and AlOx (which is exposed by the via hole) is subsequently etched either using the same or different chemistries. In general, all of the etch steps will be timed because of the small via area. However, endpointing through some realtime measurement (optical emission or gas phase RGA) is preferred. For FeRAM damage control it is especially important to control the bottom layer sidewall barrier etch process. It is preferred to use plasma conditions with smaller plasma damage and uniform etch rates with less overetch. After the via etch process, the resist is typically removed by an ash process followed by wet clean and dry.

In one example, an anneal process step is performed at step 280 of FIG. 4 after the via etch step to remove etch damage. For a PZT capacitor dielectric, this anneal may be performed at around 500–650 C. (furnace anneal is desirably around 15 min to 2 hr) or 550–700 C. (RTA is desirable for about 10 sec to about 60 sec). Even more preferred is an RTA process at around 650 C. for around 1 min. It is also preferred that the anneal be performed in an inert atmosphere (N$_2$ or Ar) so as not to oxidize the top electrode diffusion barrier. This option is preferred if the choice of interlayer dielectric is a low-K material with a maximum thermal budget of less than 500 C. If the maximum thermal budget of the first or second ILDs (112/134) makes this impossible then it is preferred to use the maximum thermal budget possible for that ILD, using an RTA process.

Once the via has been formed, the via can be filled using a standard metallization. Typical metallizations and diffusion barriers have already been described, but include metals of Cu, W, doped Al with barriers of Ta nitride or Ti/TiN. It is preferred to use a short plasma clean (Ar, Ar+N$_2$ for example) to clean the bottom of the via prior to deposition of the barrier and metal layers in a tool without any vacuum breaks between clean and deposition. For Cu, it is preferable to use Ta, TaNx or TiN barrier followed by Cu seed layer deposition. This is, preferably, followed by electroplated or deposited copper. The Cu and barrier above the interlevel dielectric is, preferably, removed by CMP. For W vias, it is preferable to use Ti/TiN barrier followed by CVD W and the excess tungsten is removed by etchback or CMP. For Al vias, a Ti/TiN barrier is followed by Al deposition (CVD, PVD with reflow, or hot PVD). The Al on top of the ILD is either removed or patterned and etched to form metal lines.

The via etch tool, post via clean, anneal tool, metal plasma clean and even barrier deposition tool can potentially become contaminated with FeRAM elements if the top electrode and PZT are not protected by a conducting hard mask and/or a diffusion barrier or sidewall diffusion barrier. Even with this protection, etch tool contamination might occur by process mistake, such as large over-etch. Therefore depending on the process control and significant monitoring, these tools can be shared instead of being dedicated. If the decision is that these tools need to be dedicated, then it might also be decided to use a backside wet clean process after the wafer leaves the last dedicated tool in order to eliminate any chance that FeRAM contamination might spread to other non-contaminated tools.

An exemplary process flow for a dual damascene process is now described. The flow described here is the via first flow, but many of the ferroelectric-specific aspects will also apply to the other process flow routes. Depending on the metallization scheme, such as Cu, a diffusion barrier/etch stop (preferably comprised of silicon carbide, silicon nitride, silicon oxygen nitride, silicon carbo-oxy-nitride) will be deposited on the ILD. Afterwards a second intermetal layer dielectric (IMD or ILD) is deposited using one of the choices described above (which is, sometimes, followed by another diffusion barrier/etch stop). Lithography is then used to pattern the vias. The vias are then etched using the same procedure as described above, but this time there are potentially multiple layers of dielectrics prior to reaching the sidewall diffusion barrier. In addition, the aspect ratio of the first (deep) via for the dual-damascene approach is larger than with just a via. After the resist ash, via etch and clean, the first vias are filled with resist and lithography for the metal pattern is performed. The metal pattern is etched into the top dielectric and the depth is either controlled during the etch process or by an etch stop. The resist is then removed and etch debris removed by wet clean.

The next exemplary step is to perform a post etch recovery anneal and now the thermal budget is limited by more dielectric layers. For a capacitor dielectric comprised of PZT, this anneal is preferably around 500–650 C. (for a furnace anneal of around 15 min to 2 hr) or 550–700 C. (for RTA process of around 10 sec to 60 sec). Even more preferred is an RTA process at around 650 C. for around 1 min. It is also preferred that the anneal be performed in an inert atmosphere ($N_2$ or Ar) so as not to oxidize the top electrode diffusion barrier. This option is preferred if the choice of interlayer dielectric is a low K material with a maximum thermal budget of less than 500 C. If the maximum thermal budget of the ILD makes this impossible then it is preferred to use the maximum thermal budget possible for that ILD using RTA process.

The next exemplary step is to deposit the barrier and metal to simultaneously fill depressions for vias and for metal lines. Typical metallizations and diffusion barrier have already been described but for a damascene process these include Cu, W and doped Al with barriers of Ta, TaNx, or Ti/TiN. It is preferred to use a short plasma clean (Ar, Ar+$N_2$ for example) to clean the bottom of the via prior to deposition of the barrier and metal films in a tool without any vacuum breaks between clean and deposition.

The contamination issues with a dual damascene approach are similar to that of via first approach.

Interconnect 136 is formed so as to provide the electrical connection to the top electrode. The interconnect is connected to conductor 144 which is, preferably, connected to a drive line. The drive line is preferably brought to a potential around 1.2 volts during the operation of the device and this voltage will be scaled with the logic technology generation used.

The present invention is directed to a method of addressing the reduction of $IrO_2$ when employed as a bottom electrode in an FeRAM capacitor. As discussed supra, an FeRAM capacitor has top and bottom electrodes, between which a ferroelectric dielectric material is interposed. When PZT (Pb(Zr, Ti)$O_3$) films, for example, are employed as the ferroelectric dielectric material, the inventors of the present invention have found that electrically conductive oxide electrodes have substantially greater fatigue resistance than noble metal electrodes such as Pt or Ir. That is, the oxide electrodes exhibit a greater resistance to polarization loss after a large number of polarization reversals. Therefore after an FeRAM has its polarization reversed or cycled a substantial number of times, FeRAM capacitors with conductive oxide electrodes exhibit less polarization loss than FeRAM capacitors employing solely noble metal electrodes. Several of the conductive oxides that have been investigated for such applications include, for example, $SrRuO_3$, (La, Sr)$CoO_3$, $RuO_2$ and $IrO_2$.

The inventors of the present invention discovered that in some process steps subsequent to the formation of a conductive oxide bottom electrode, for example, the formation of the ferroelectric dielectric film, a reducing ambient exists in which the oxide electrode can lose oxygen associated therewith. Such oxygen loss in the bottom conductive oxide electrode is undesirable since it contributes to a degraded fatigue resistance of the FeRAM capacitor. For example, when a PZT ferroelectric film is deposited by MOCVD, the hydrocarbons present in the solvent and the precursors create a reducing ambient, and under such conditions a bottom oxide electrode can lose oxygen depending on its chemical diffusion coefficient through the material. Initial experiments performed on $IrO_2$ electrodes indicate that oxygen diffuses out and $IrO_2$ reduces to IrOx, wherein $0.8<X<0.9$. The oxygen content in the oxide film was measured by wavelength dispersive X-ray fluorescence (WDXRF) using $IrO_2$ standards. Depending on the kinetics of the PZT deposition and the chemical diffusion coefficient of oxygen in $IrO_2$, however, one could expect the oxide film to completely reduce to Ir.

Thermodynamically, the reduction of $IrO_2$ should not occur readily because $IrO_2$ is stable. The inventors of the present invention, however, believe that a kinetics issue is a root cause of the reduction of conductive oxide film. For example, organics easily oxidize by reducing $IrO_2$ and do so quickly; although $IrO_2$ is stable, it has a small free energy and therefore the kinetics of any such reduction occurs quickly. Although $IrO_2$ will still oxidize in such an environment, any such oxidation thereof occurs relatively slowly compared to the reduction. Therefore in a short window of time, a net reduction of oxygen in the film may be observed, however, if the process is slowed, more time may be available to re-oxygenate the IrOx film to obtain $IrO_2$ as desired.

In accordance with one exemplary aspect of the present invention, in appreciating a mechanism by which FeRAM performance is negatively impacted, a method of depositing or otherwise forming a bottom electrode in an FeRAM capacitor is disclosed. More particularly, a method of forming a bottom conductive oxide electrode is provided in which an over-oxygenated bottom conductive oxide electrode is initially deposited. Subsequently, during a ferroelectric dielectric material deposition, oxygen loss from the bottom electrode film still occurs, however, the excess oxygen in the conductive oxide film compensates for such loss. Accordingly, after the subsequent processing steps, sufficient oxygen remains within the bottom electrode film to provide the advantageous improved fatigue resistance over conventional pure noble metals electrodes.

Figure 6:
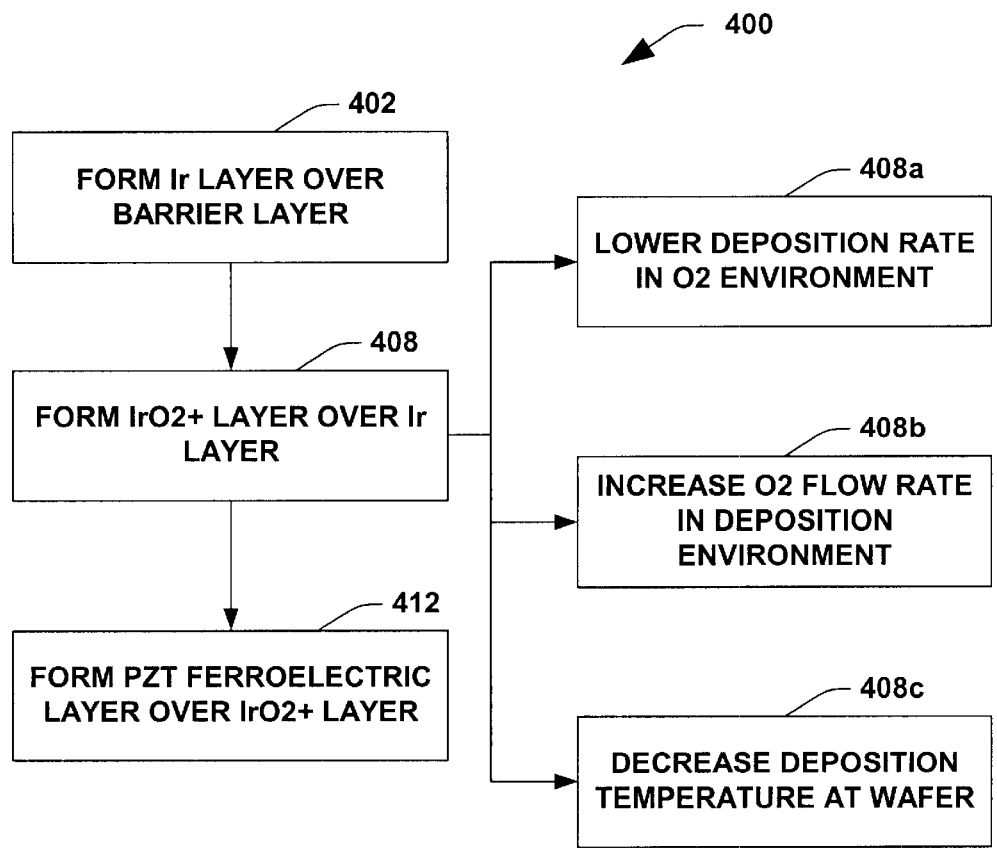
FIG. 6 is a flow chart diagram illustrating a method of forming an FeRAM capacitor having a bottom electrode containing an over-oxygenated iridium oxide film in accordance with an aspect of the present invention.
Figure 7:
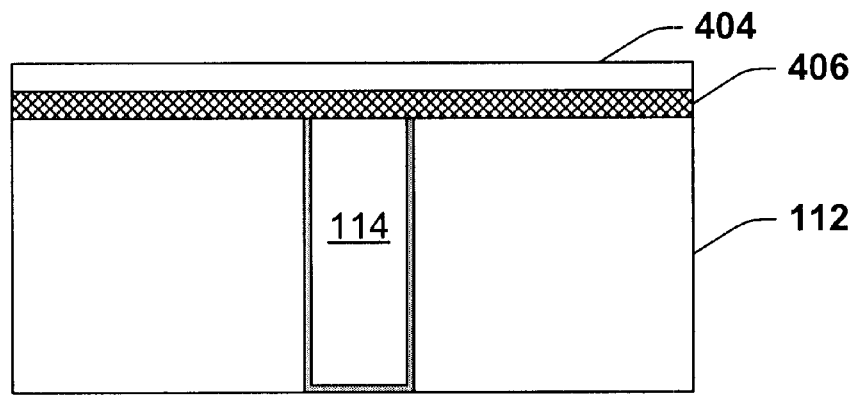
FIGS. 7–9b are fragmentary cross section diagrams illustrating various steps in forming an FeRAM capacitor having an over-oxygenated iridium oxide film as a bottom electrode in accordance with the present invention.

FIG. 6 is a flow chart illustrating a method 400 of addressing oxygen reduction of a bottom electrode film in the formation of an FeRAM capacitor according to one exemplary aspect of the present invention. The method 400 of FIG. 6 will be discussed in conjunction with FIGS. 7–9b in order to aid in an understanding of the invention. The method 400 begins at 402, wherein an iridium (Ir) layer 404 is formed over a barrier layer 406, as illustrated in FIG. 7. The barrier layer 406 is formed over the interlevel dielectric 112 after the formation of contacts 114 which provide electrical connection down to the transistor circuitry associated with the substrate (not shown). The barrier layer 406 acts as a diffusion barrier to prevent oxidation of the underlying tungsten material 114 typically employed as the contacts, and may comprise, for example, CVD TiN and/or PVD TiAlN, respectively.

The Ir layer formation at 402, in this example, forms a first portion of the bottom electrode, and is advantageous because it provides a low contact resistance for the capacitor to the contacts, and also helps to prevent oxidation of the underlying diffusion barrier layer 406 during subsequent processing. Alternative noble metals may also be used and comprise, for example, Pt, Pd, Au, Ru and Rh, or any stack combination thereof. The Ir layer 404 (FIG. 7) forming the first portion of the bottom electrode layer is relatively thin, for example, about 10–30 nm thick and is deposited via sputtering with Ar or via CVD.

Figure 8:
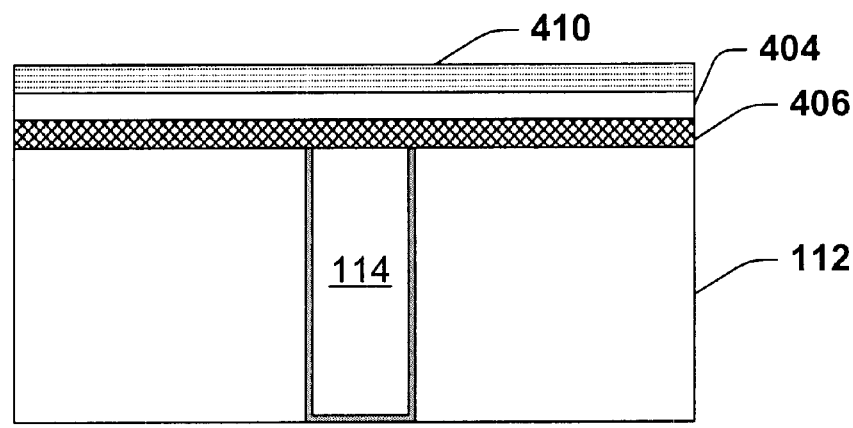

The method 400 then continues at 408, wherein an over-oxygenated film 410 (FIG. 8), for example, $IrO_{2+X}$, is formed over the first portion 404 of the bottom electrode (e.g., the noble metal layer), as illustrated in FIG. 8. In one example, the amount of oxygen within the over-oxygenated film may fall within a range wherein for $IrO_{2+X}$, X is about 0.1 or more and about 1.0 or less. In accordance with one aspect of the present invention, an over-oxygenated film 410 is formed in an oxygen environment at a slower rate than would otherwise be conventionally formed. Typically, films are formed as quickly as possible in order to maximize the throughput of expensive manufacturing equipment. For example, when $IrO_2$ is formed via a reactive sputter deposition process with $Ar+O_2$, the deposition rate was conventionally about 10–20 Angstroms/minute.

In accordance with one exemplary aspect of the present invention, the over-oxygenated film is about 10 nm or more and about 100 nm or less. In another example, the thickness range may be about 10 nm or more and about 40 nm or less. Furthermore, in one particular example, the total bottom electrode thickness including the iridium layer and the over-oxygenated iridium oxide layer is about 70 nm thick, with the iridium layer having a thickness of about 30 nm and the over-oxygenated film being about 40 nm thick.

Instead of further increasing the deposition rate, as is typically desirable, the inventors of the present invention reduce the deposition rate of the conductive oxide film while maintaining an amount of oxygen in the deposition environment about the same. For example, wherein a conventional $IrO_2$ deposition process occurs in an $Ar/O_2$ environment of about 40–50% $O_2$, a deposition rate is about 10–20 Angstroms/minute. In accordance with one exemplary aspect of the present invention, the $O_2$ environment is maintained at about 40–50% and the deposition rate is decreased to about 5–10 Angstroms/minute, as illustrated in FIG. 6 at reference numeral 408a. Consequently, more oxygen is exposed to the Ir as it is reactively sputtered per unit time, thereby increasing an oxygen content associated with the resulting oxide, to form $IrO_{2+X}$. Any manner of decreasing the deposition rate of the conductive oxide film may be employed and is contemplated as falling within the scope of the present invention. For example, one may decrease the applied power to the deposition system, for example, from typically about 700 W to about 350 W. Increasing the total flow of oxygen during deposition can lower the deposition rate. Typical flows would be from 30 sccm to 50 sccm, for example. One can also increase the total pressure during deposition to decrease the deposition rate keeping the ratio of the gases constant.

In accordance with another exemplary aspect of the present invention, an over-oxygenated conductive oxide film is formed by increasing the oxygen flow rate associated with the deposition process, as illustrated in FIG. 6 at reference numeral 408b. For a desired deposition rate of, for example, about 10–20 Angstroms/minute in an $Ar/O_2$ environment, an $O_2$ flow rate is conventionally driven to obtain about a 40–50% $O_2$ environment to obtain the desired stable $IrO_2$. In accordance with the present invention, in order to over-oxygenate the conductive oxide film, the $O_2$ flow rate is increased for the above deposition rate of about 10–20 Angstroms/minute so that the deposition environment contains approximately 60–70% $O_2$. In the above manner, since more $O_2$ is available during deposition, more $O_2$ forms in the film, thus resulting in the desired $IrO_{2+X}$.

In accordance with yet another aspect of the present invention, an over-oxygenated conductive bottom electrode film is formed via reactive sputtering in an $Ar/O_2$ environment by decreasing the film deposition temperature, as illustrated in FIG. 6 at reference numeral 408c. Temperature is a coarse knob for controlling the microstructure for any film deposited by PVD or CVD. Decreasing the temperature lowers the diffusion of the film components, for example, in the present case Ir and O, thus leading to smaller grain size, and at low enough temperatures, an amorphous-like microstructure. The fine microstructure thus formed also helps in retarding the out-diffusion of oxygen during PZT deposition.

Figure 9A:
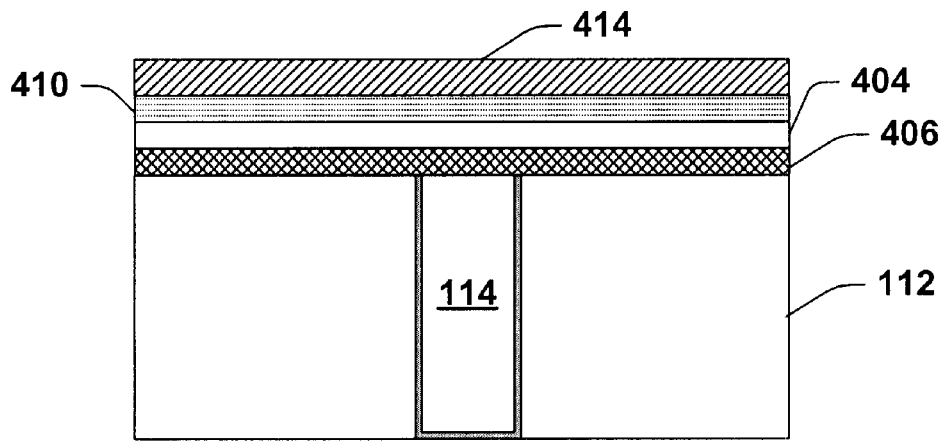
Figure 9B:
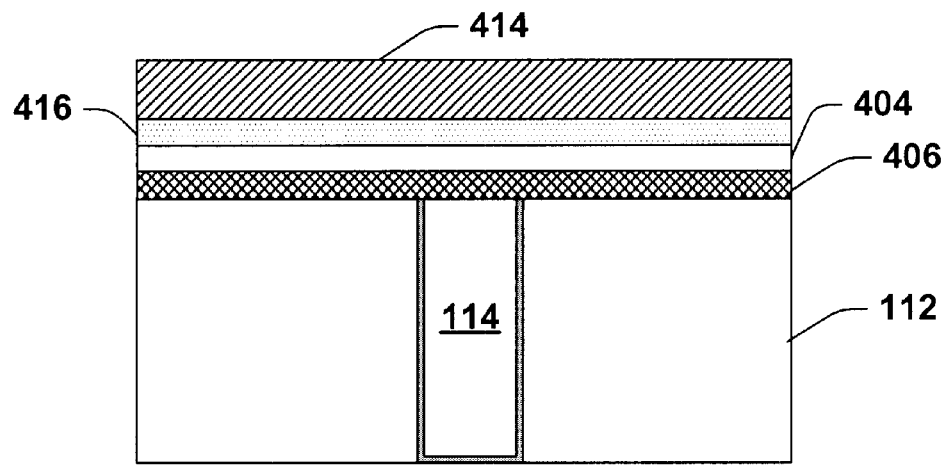

Returning now to FIG. 6, once the over-oxygenated conductive oxide film (e.g., $IrO_{2+X}$) is formed at 408, the ferroelectric dielectric material is formed thereover at 412, as illustrated in FIGS. 9a and 9b at reference numeral 414. For example, the ferroelectric dielectric material may comprise PZT. In initially forming the PZT layer 412, for example, via MOCVD, in FIG. 9a wherein the PZT is in the process of formation, a reducing ambient exists, wherein oxygen within the over-oxygenated conductive oxide film diffuses thereout. However, since the conductive oxide film 410 of FIG. 9a is over-oxygenated, although some reduction occurs, a stable conductive oxide 416 still remains after such processing, as illustrated in FIG. 9b (e.g., $IrO_2$), thereby providing an FeRAM capacitor having improved fatigue resistance over the prior art.

It should be noted that the discussion above focused primarily on the content and method of formation of the bottom capacitor electrode, since the bottom electrode is subjected to a reducing ambient during the subsequent PZT formation process thereover. It should be understood that although not necessarily required, the present invention also contemplates forming the top electrode with an over-oxygenated iridium oxide film in a similar manner, and such variations are contemplated as falling within the scope of the present invention.

In accordance with another aspect of the present invention, a method of addressing a reduction of the iridium oxide bottom electrode during the formation of the ferroelectric dielectric is provided. With regard to this exemplary aspect, a microstructure associated with the iridium oxide portion of the bottom electrode is controlled in order to prevent or reduce an amount of oxygen loss associated therewith. In order to appreciate more fully the inventive features of the present invention, a brief discussion of the reduction of iridium oxide will be provided below.

Figure 10A:
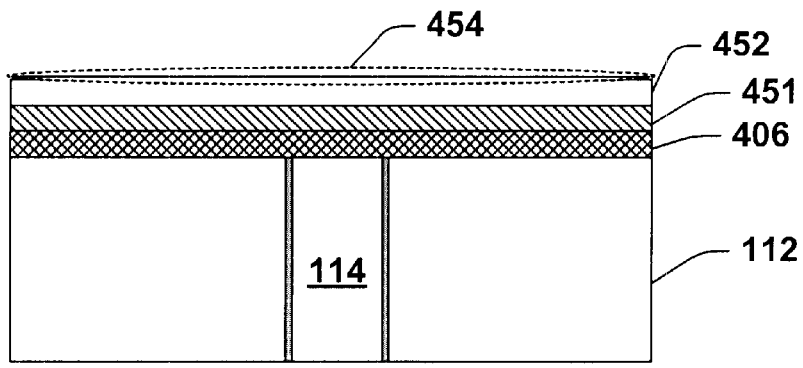
FIGS. 10a–10c are fragmentary cross section diagrams illustrating an oxygen transport mechanism through an iridium oxide film employed as a bottom electrode.
Figure 10B:
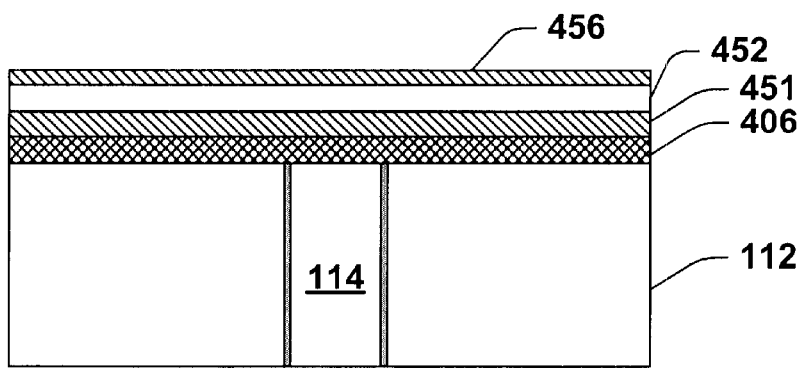

Upon forming a ferroelectric dielectric layer 450 over an iridium/iridium oxide bottom electrode 451/452 (the bottom electrode itself overlying the barrier layer 406), a reduction of the exposed iridium oxide layer 452 would be expected due to the reducing ambient present during ferroelectric dielectric layer formation; however, such a reduction would initially appear to be limited. The limitation on the reduction would be predicted because as a top portion 454 of the iridium oxide 452 is reduced, as illustrated in FIG. 10a, at some time the reduction would cause the top surface 454 of the iridium oxide to reduce completely, thereby leaving a thin layer of iridium 456 overlying the remaining iridium oxide 452, as illustrated in FIG. 10b. Once the iridium layer 456 is formed by reduction of the top portion 454 of the iridium oxide 452, one would expect further reduction to be stopped because oxygen transport through the iridium 456 is extremely low.

Figure 10C:
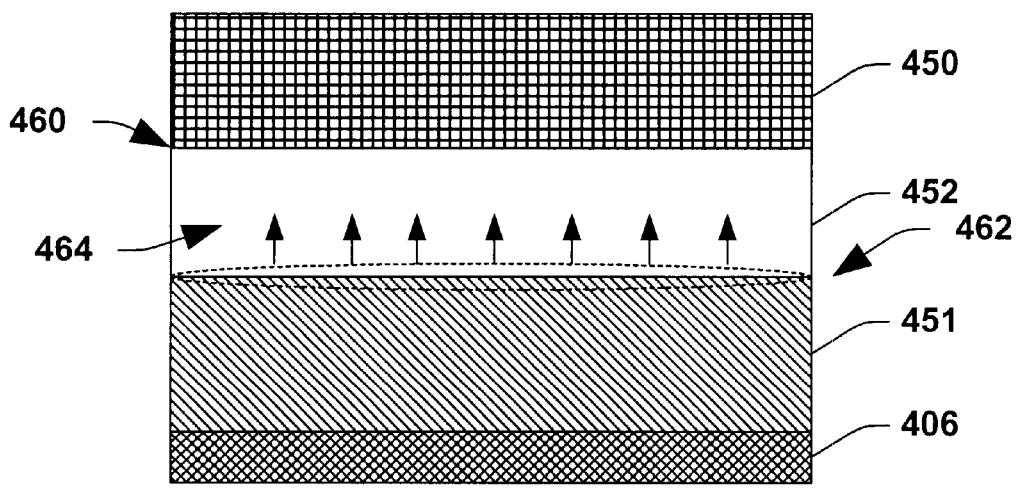

The inventors of the present invention, upon evaluating the iridium oxide 452 during the ferroelectric dielectric layer formation, however, did not observe the above phenomena of FIG. 10b, as would be expected, but rather observed that the entire iridium oxide layer 452 tends to reduce. As discussed above, such a substantial reduction of the iridium oxide causes the bottom electrode to comprise primarily iridium which, although functional, reduces disadvantageously the fatigue resistance of the FeRAM capacitor. Accordingly, the inventors of the present invention posit that the reduction of the iridium oxide does not begin at the iridium oxide/ferroelectric dielectric interface 460, but instead begins at the iridium/iridium oxide interface 462, as illustrated in FIG. 10c. Therefore the oxygen is diffusing from the bottom interface 462 up through the iridium oxide 452 to the reducing ambient while the ferroelectric dielectric layer 450 is being formed, as illustrated at 464 of FIG. 10c. The inventors, appreciating this phenomena, reduce or eliminate the reduction of iridium oxide by frustrating the oxygen transport mechanism though the iridium oxide, as will be discussed in greater detail below.

Figure 11:
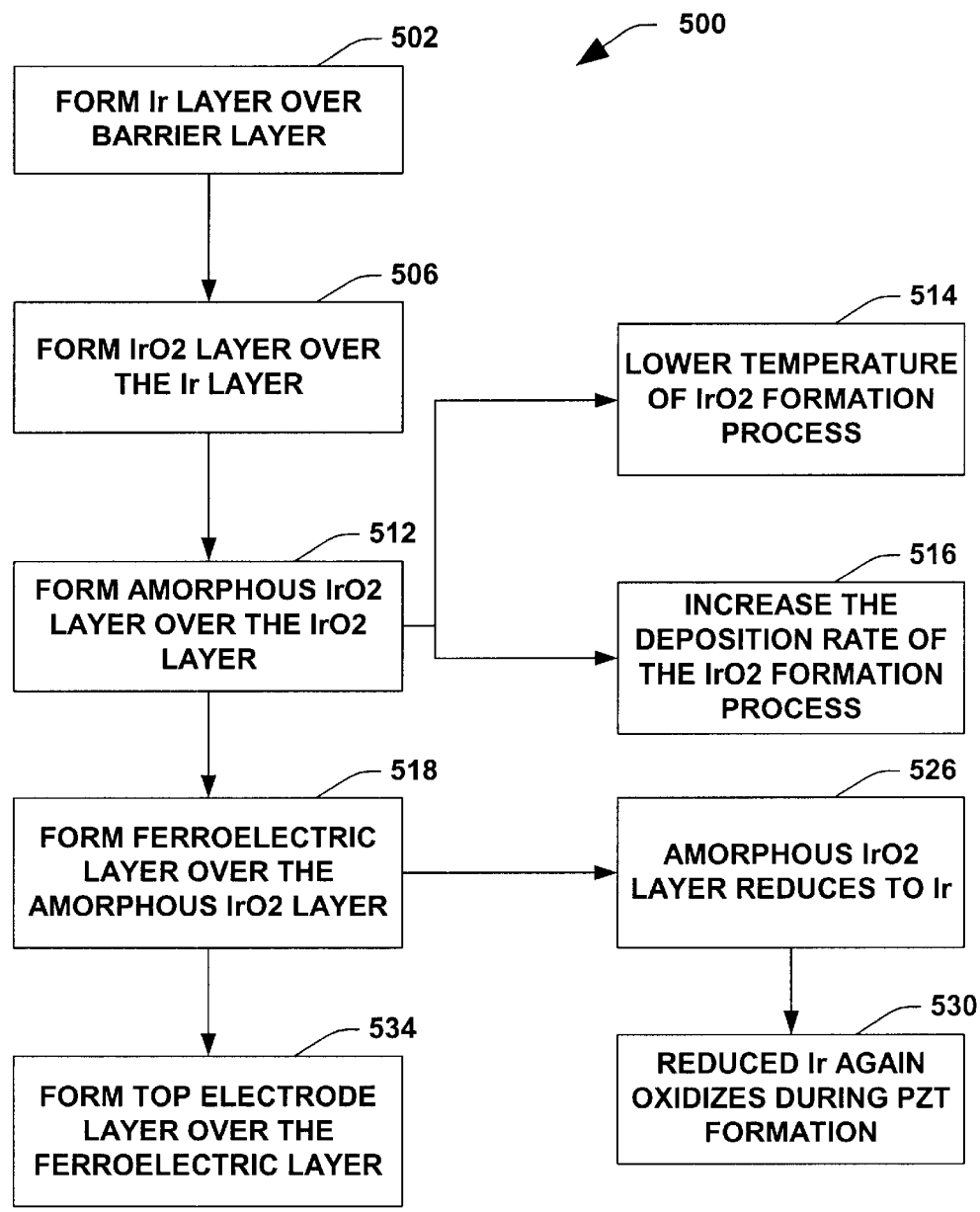
FIG. 11 is a flow chart diagram illustrating a method of forming an FeRAM capacitor having a bottom electrode containing an amorphous iridium oxide film used to frustrate oxygen transport therethrough during subsequent processing according to the present invention.
Figure 12A:
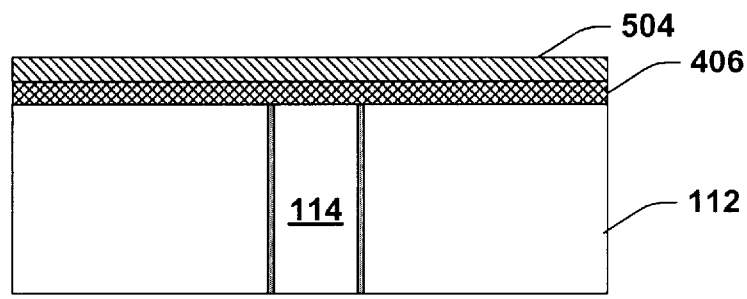
FIGS. 12a–12f are fragmentary cross section diagrams illustrating steps in forming an FeRAM capacitor having a bottom electrode which contains an amorphous iridium oxide film according to the present invention.

A method by which the reduction of oxygen out of the conductive oxide film 452 is frustrated is illustrated in the flow chart of FIG. 11, and designated at reference numeral 500, and will be illustrated and discussed further in conjunction with FIGS. 12a–12f. Initially, a first portion of the bottom electrode of an FeRAM capacitor is formed at 502, wherein an iridium layer (Ir) 504 is formed over a substrate (e.g., a substrate having circuitry formed therein covered by a dielectric having conductive contact(s) 114 formed therein and a barrier layer 406 thereover), as illustrated in FIG. 12a. Such an iridium layer 504 is formed, for example, using a sputter deposition process or via chemical vapor deposition to a thickness of about 20–400 Angstroms. As discussed above, the iridium layer 504 provides a low contact resistance for the FeRAM capacitor to underlying transistor structures through electrically conductive contacts such as tungsten plugs.

Figure 12B:
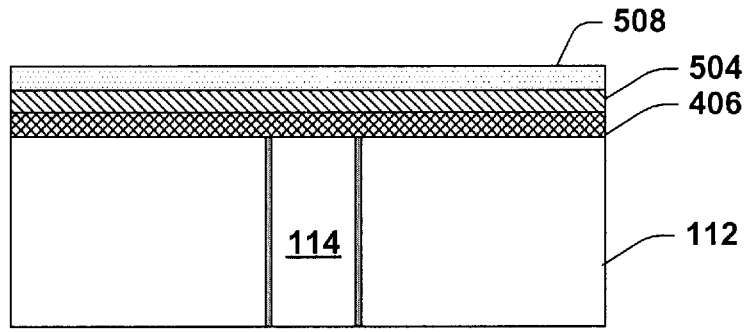
Figure 12C:
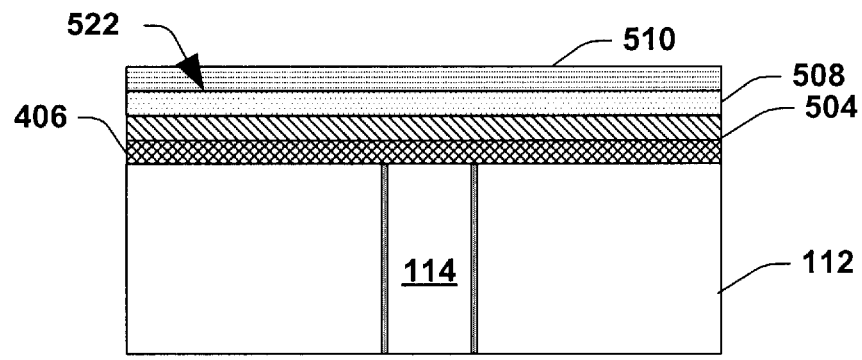

The method 500 continues at 506, wherein an iridium oxide layer ($IrO_2$) 508 is formed over the iridium layer 504 using, for example, reactive sputtering, as illustrated in FIG. 12b. In such an example, an $Ar/O_2$ environment within the sputtering chamber contains about 40–50% $O_2$ and a deposition rate is about 10–20 Angstroms/second with a heater temperature of about 550 C. (temperature at the wafer being about 350–400 C.). The thickness of the $IrO_2$ layer 508 may be about 20–400 Angstroms, for example. After the $IrO_2$ layer 508 is formed at 506, an amorphous iridium oxide ($IrO_2$) layer 510 is formed thereover at 512, as illustrated in FIG. 12c. As will be discussed in greater detail below, the amorphous $IrO_2$ layer 510 operates to mitigate the negative consequences associated with the reduction of $IrO_2$ 508 during subsequent processing steps.

In accordance with one exemplary aspect of the present invention, the amorphous $IrO_2$ layer 510 may be formed by maintaining the reactive sputtering deposition process highlighted above, but lowering the temperature within the deposition chamber at 514 of FIG. 11. For example, whereas a stable $IrO_2$ is formed at about 350–400 C. at the wafer, amorphous $IrO_2$ may be formed by lowering the deposition temperature at the wafer to between about room temperature and about 200 C.

Alternatively, an amorphous $IrO_2$ film 510 may be formed by maintaining most of the above process conditions for $IrO_2$, but increasing the deposition rate substantially above 20 Angstroms/second, for example, to about 40 Angstroms/second, as illustrated at 516 in FIG. 11. One exemplary way of increasing the deposition rate of the iridium oxide to form the amorphous layer 510 is to increase the power to the sputter chamber, however, any manner of increasing deposition rate may be employed. Further, although a couple of exemplary methods of forming an amorphous $IrO_2$ film 510 are provided above, it should be understood that any method by which an amorphous $IrO_2$ is formed may be employed and is contemplated as falling within the scope of the present invention. Another way is to reduce the temperature as described earlier from about 500 C. to about room temperature.

The amorphous iridium oxide layer 510, in one example, may have a thickness of about 10 nm or more and about 200 nm or less. In another example, the layer 510 is about 100 nm thick or less, and in yet another example, the layer 510 has a thickness of about 40 nm or less. Furthermore, in accordance with another exemplary aspect of the present invention, a total thickness of the bottom electrode layer is about 70 nm, wherein the iridium layer 504 has a thickness of about 30 nm, and the iridium oxide layer 508 and the amorphous iridium oxide layer 510 each have a thickness of about 20 nm, respectively.

Figure 12D:
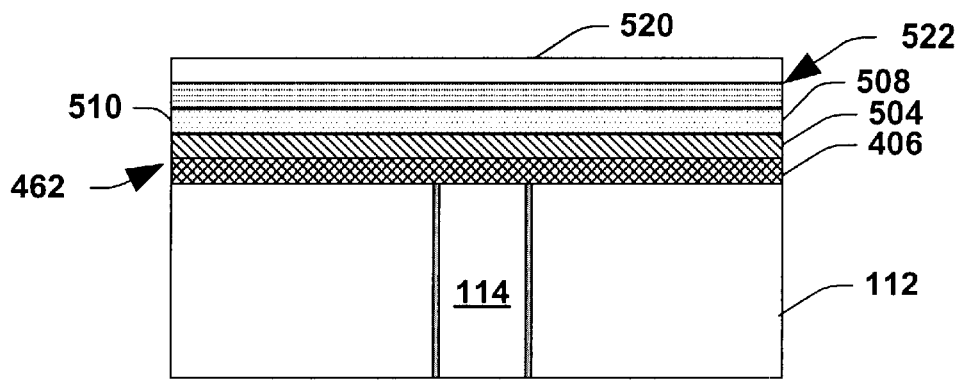

After the amorphous $IrO_2$ layer 510 is formed at 512, the bottom electrode of the FeRAM capacitor is defined, however, the composition and/or character thereof will change during subsequent processing, as will be described below. The method 500 continues at 518, wherein a ferroelectric dielectric layer 520, for example, PZT, is formed over the amorphous $IrO_2$ layer 510, as illustrated in FIG. 12d. As discussed above, a reducing ambient exists during the fabrication of the ferroelectric dielectric layer 520 which causes the $IrO_2$ to want to reduce. In the conventional process, as discussed above, such reduction started at the $Ir/IrO_2$ interface 462 with the oxygen diffusing through the $IrO_2$ 508 relatively easily.

In the present invention, the amorphous $IrO_2$ 510 provides a microstructure (for example, a fine-grained structure) that reduces the diffusivity of oxygen out of the underlying $IrO_2$ 508, thus preventing reduction at the $Ir/IrO_2$ interface 462.

Figure 12E:
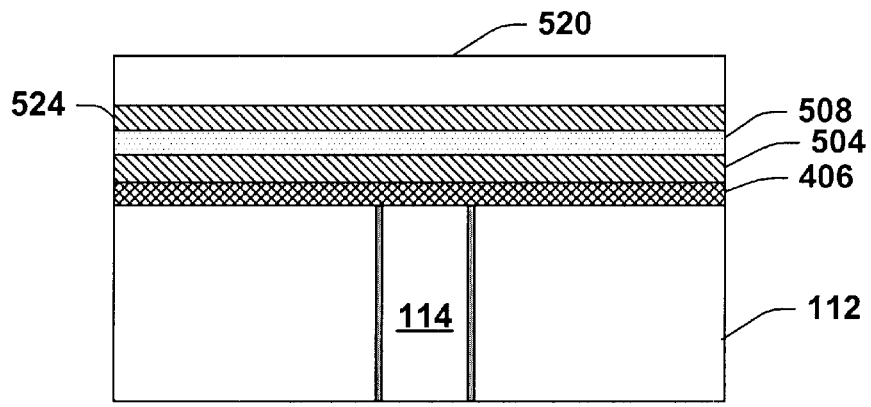

Instead, in the method 500 of FIG. 11, reduction occurs at the amorphous IrO₂ surface 522 during the formation of the ferroelectric dielectric 520, thereby causing the amorphous IrO₂ 510 to reduce to Ir 524 over the IrO₂ layer at 508, as illustrated in FIG. 12e. Since the oxygen transport through the newly formed Ir 524 is extremely low, once the amorphous IrO₂ 510 reduces to Ir 524, further reduction almost completely stops, thereby maintaining the oxygen content in the underlying IrO₂ 508.

Figure 12F:
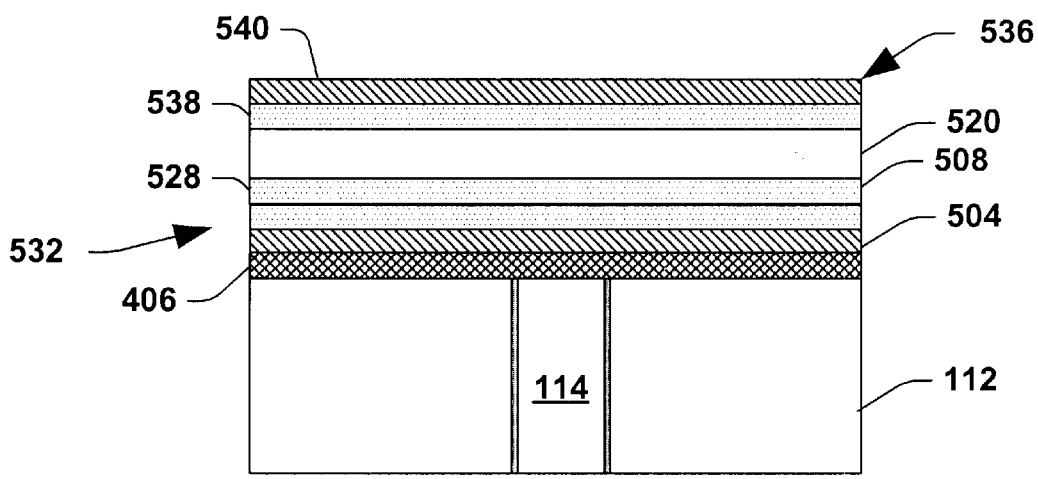

In addition, as the ferroelectric dielectric layer 520 continues to be formed, the oxygen present during processing promotes oxidation, which causes the newly formed, thin Ir layer 524 overlying the IrO₂ 508 to oxidize, thus converting the overlying Ir layer 524 back to IrO₂ 528 at 530, as illustrated in FIG. 12f. Therefore after the formation of the ferroelectric dielectric layer 520 has finished, the overlying Ir 524 has substantially fully converted back to IrO₂ 528, wherein an IrO₂ layer 508, 528 overlies the Ir layer 504 to define the bottom electrode 532. The method 500 then concludes at 534 by forming a top electrode 536 over the ferroelectric dielectric layer 520, for example, an IrO₂ film 538 followed by an Ir film 540 thereover, as illustrated in FIG. 12f.

In another aspect of the present invention, the amorphous iridium oxide film 510 is formed directly over the iridium layer 504 without the iridium oxide layer 508 disposed therebetween. In such an event, the amorphous iridium oxide reduces slowly during subsequent PZT deposition, and then begins re-oxidizing to result in an iridium oxide layer over the iridium layer 504. In such an example, the iridium layer 504 may have a thickness of about 30 nm, and the amorphous iridium layer has a thickness of about 40 nm. In yet another aspect of the present invention, the amorphous iridium oxide film 510 may be deposited directly over the diffusion barrier, layer, thereby eliminating the iridium bottom electrode layer altogether.

According to another exemplary aspect of the present invention, a bottom electrode layer is formed by depositing an iridium layer and then depositing an oxygen doped iridium layer (as opposed to an IrO₂ layer) thereover. In the above manner, since the subsequent ferroelectric layer formation does not see an IrO₂ layer at its bottom interface, but rather sees an Ir layer, no reduction occurs. However, as the ferroelectric layer process progresses, the oxygen within the oxygen doped Ir layer and the Ir segregate at the ferroelectric layer interface to form a thin IrO₂ layer and thus provide improved fatigue resistance over conventional structures. In addition, since the IrO₂ forms during the ferroelectric layer formation, reduction thereof does not occur, thereby resulting in a high quality conductive oxide bottom electrode layer.

Figure 13:
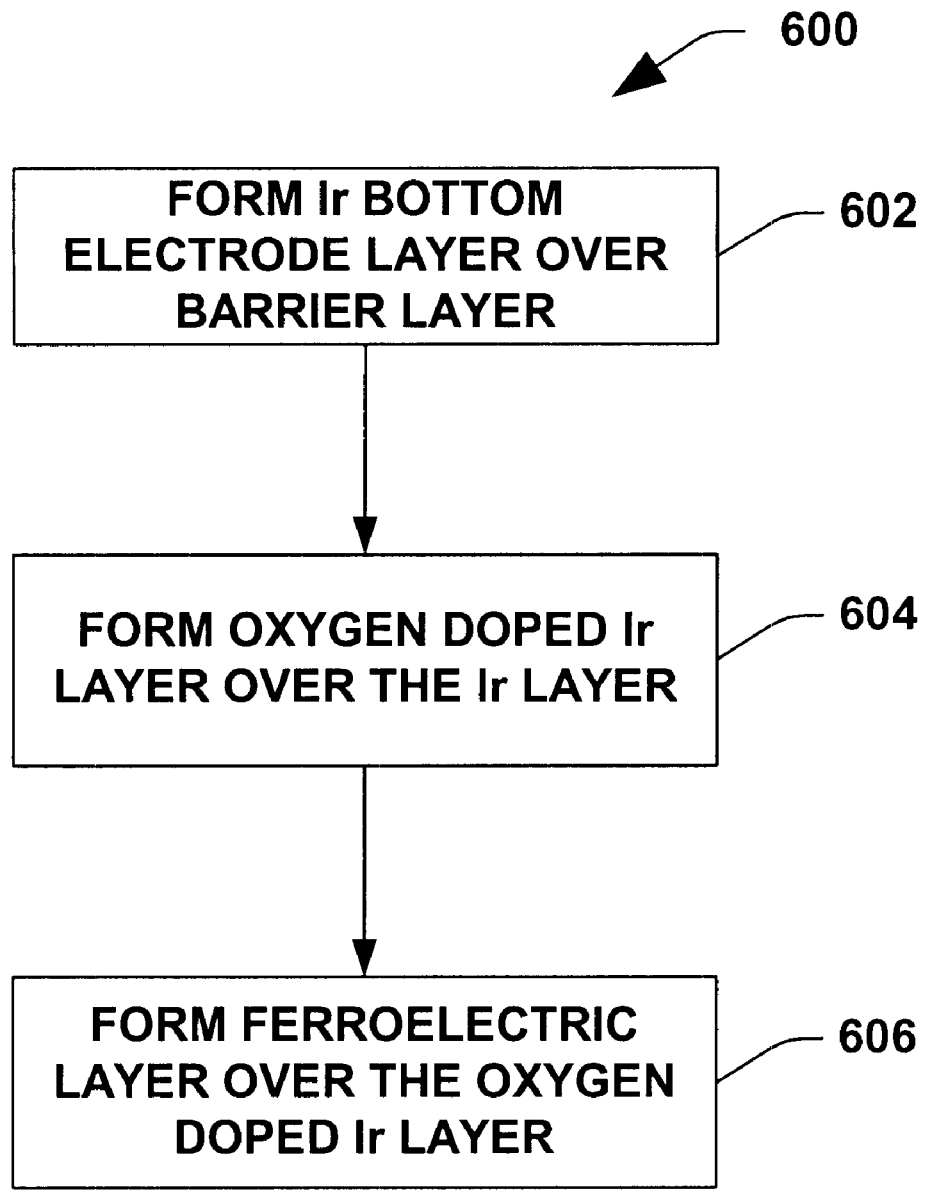
FIG. 13 is a flow chart diagram illustrating a method of forming an FeRAM capacitor having a bottom electrode which contains an oxygen doped iridium layer according to the present invention.
Figure 14A:
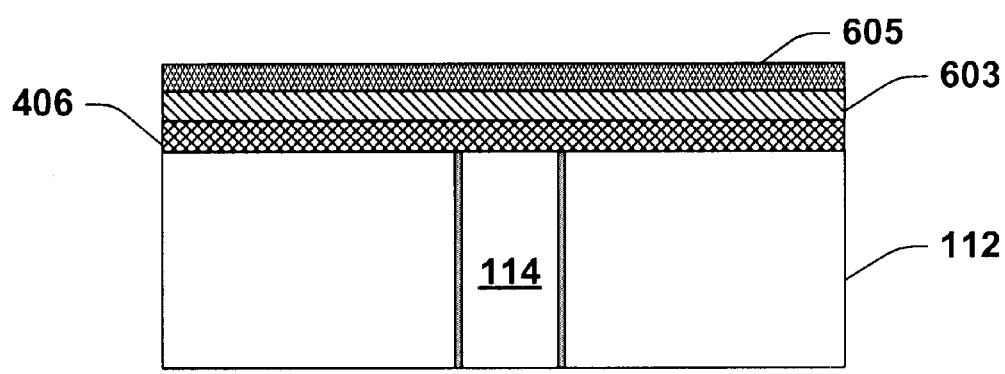
FIGS. 14a–14b are fragmentary cross section diagrams illustrating steps in forming an FeRAM capacitor having a bottom electrode which contains an oxygen doped iridium layer according to the present invention.

In accordance with one exemplary aspect of the present invention, a method of forming an FeRAM capacitor having a conductive oxide bottom electrode is illustrated in FIG. 13, and designated at reference numeral 600. Initially, a noble metal layer is deposited over a barrier layer 406 which overlies a substrate 112 to form a first portion of a bottom electrode layer at 602. For example, an Ir layer 603 may be formed, as illustrated in FIG. 14a. As discussed previously, the Ir provides a low contact resistance to underlying circuitry as well as other advantages, however, such a layer is not required by the present invention.

Subsequently, an oxygen doped Ir layer 605 is formed over the Ir layer at 604, as illustrated in FIG. 14a. In accordance with one aspect of the present invention, the oxygen doped Ir layer 605 may be formed via sputtering in an oxygen containing ambient such as Ar/O, wherein a percentage of oxygen therein is about 10–30%. In the above manner, there is insufficient oxygen present for the Ir within the layer 605 to oxidize, however, mono-dissolved oxygen will be present in the Ir. Alternatively, the Ir layer 605 may be deposited followed by an oxygen ion implantation. In various tests, the inventors of the present invention found that one can put a substantial amount of oxygen into Ir, and crystallographically a single phase Ir layer 605 is formed. Not only did X-ray analysis reveal single phase Ir under the above conditions, but an analysis of the top surface of the oxygen doped Ir layer 605 was found to be relatively smooth with no evidence of a two phase IrO₂.

In the above example, the oxygen doped iridium layer is formed over an iridium layer. In accordance with another aspect of the present invention, the oxygen doped iridium layer is formed directly over the diffusion barrier layer, and the iridium layer is thus eliminated, thereby reducing a height of the capacitor. In addition, in one example, the iridium layer and the oxygen doped iridium layer may each have a thickness of about 10 nm or more and about 200 nm or less. In another example, each layer is about 100 nm thick or less, and in yet another example, each layer has a thickness of about 40 nm or less. Furthermore, in accordance with another exemplary aspect of the present invention, a total thickness of the bottom electrode layer is about 70 nm, wherein the iridium layer has a thickness of about 30 nm, and the oxygen doped iridium layer has a thickness of about 40 nm. Lastly, in the above example, the oxygen doped iridium layer has a composition of IrOx, wherein X is about 0.1 or more and about 1.5 or less.

Figure 14B:
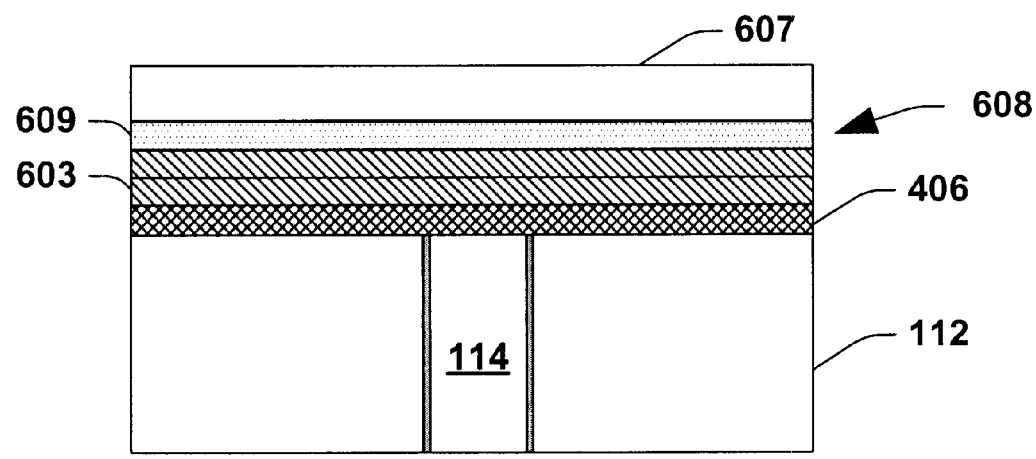

After the oxygen doped Ir layer 605 is deposited at 604, a ferroelectric layer 607 is formed thereover at 606, for example, a PZT layer in a manner as described previously, and as illustrated in FIG. 14b. What happens during the PZT deposition is not fully clear, however, the inventors of the present invention speculate that during PZT formation and or during subsequent anneals, the oxygen and Ir segregate at the Ir/PZT interface 608, thus causing the Ir at the interface to oxidize and form IrO₂ 609. However, since the PZT does not see IrO₂ at its interface during initial formation, but rather sees only Ir, no reduction occurs. Further, since the Ir oxidizes during the subsequent anneals, the resulting IrO₂ layer 609 at the PZT bottom interface 608 is not reduced. Consequently, after subsequent formation of the top electrode (not shown), the resulting FeRAM capacitor will exhibit strong fatigue resistance due to the quality IrO₂ layer serving as a portion of the bottom electrode (and, for example, also as a portion of the top electrode, as may be appreciated). There is a process window in oxygen flow that can be exploited to deposit oxygen doped Ir. With O2/Ar=0, one would get Ir films and depending on the temperature (e.g. 550 C.) and power (e.g. 350 W) used, for O2/Ar=40% one gets IrO2 films. Under these conditions of temperature and power, oxygen doped Ir films can be obtained for O2/Ar less than 40%.

According to another aspect of the present invention, a reduction of an iridium oxide bottom electrode layer during subsequent formation of a ferroelectric dielectric layer is substantially reduced by forming a titanium layer over the iridium oxide layer prior to PZT formation. The titanium layer then oxidizes during PZT formation due to the oxygen ambient processing conditions. The titanium oxide substantially retards reduction of oxygen out of the IrO₂, thereby substantially maintaining the integrity of the conductive oxide bottom electrode. In addition, the titanium oxide nucleates relatively easy during the subsequent PZT deposition and provides a good microstructure for a high quality PZT film. Lastly, as the PZT formation continues, the titanium oxide assimilates into the PZT film, thereby effectively going away and leaving a high quality PZT film overlying an $IrO_2$ bottom electrode that has not substantially reduced.

Figure 15:
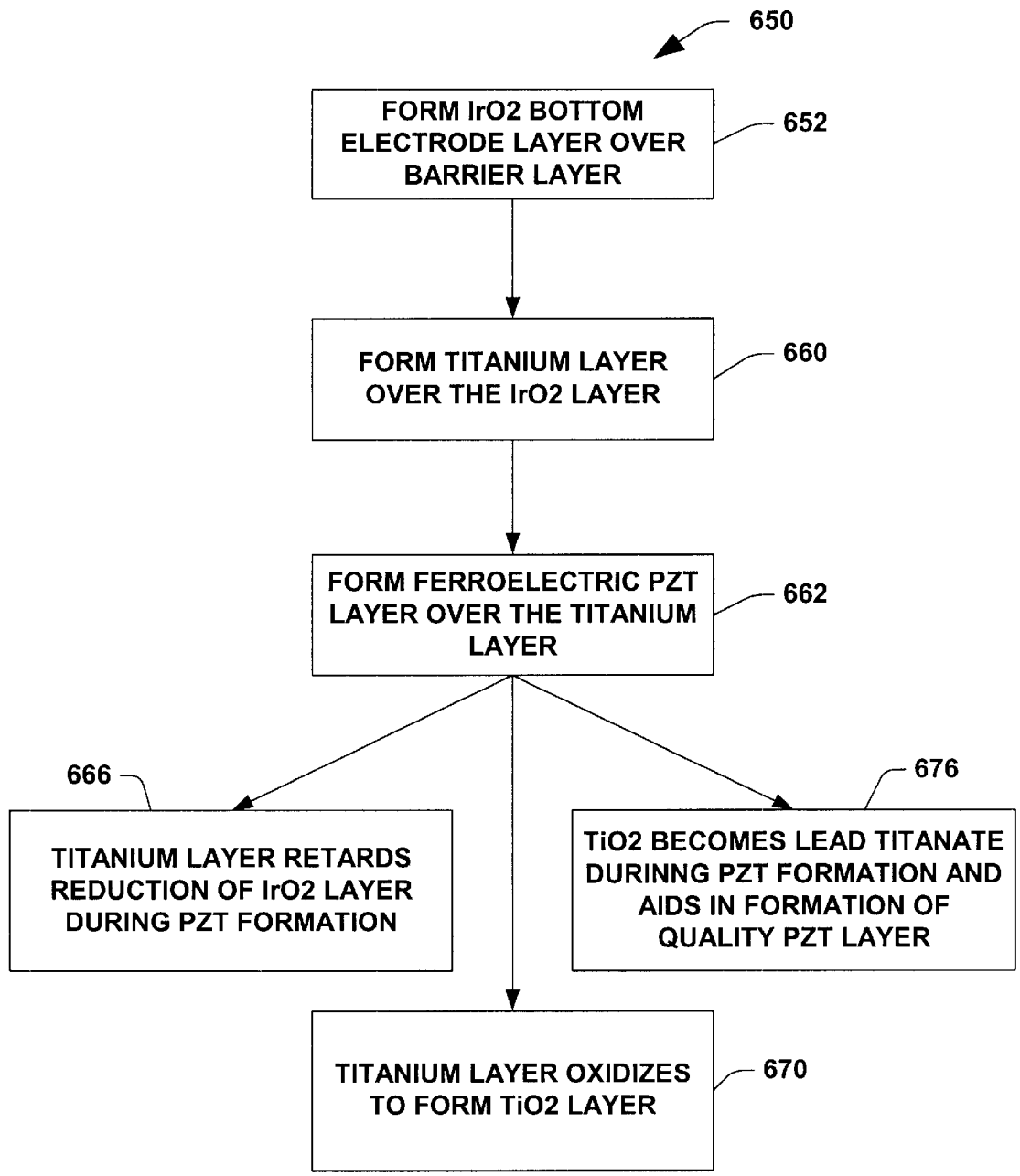
FIG. 15 is a flow chart diagram illustrating a method of forming an FeRAM capacitor having a bottom electrode containing a titanium layer according to the present invention.
Figure 16A:
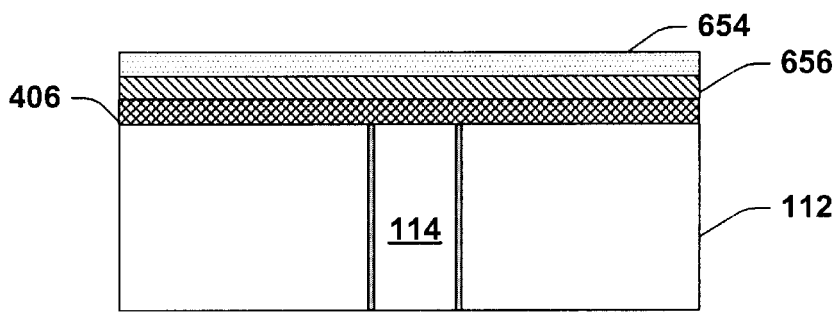
FIGS. 16a–16g are fragmentary cross section diagrams illustrating steps in forming an FeRAM capacitor having a bottom electrode which contains a titanium layer which is subsequently incorporated into the ferroelectric dielectric layer during subsequent processing according to the present invention.

In accordance with one exemplary aspect of the present invention, a method of forming an FeRAM capacitor having a conductive oxide bottom electrode is illustrated in FIG. 15, and designated at reference numeral 650. Initially, at 652, an iridium oxide bottom electrode layer 654 is formed, for example, via reactive sputtering, over a barrier layer 406 as illustrated in FIG. 16*a*. The $IrO_2$ layer 654 may be formed over an Ir layer 656 for the advantageous reasons highlighted supra, however, such a layer is not required by the present invention. In addition, in one example, the iridium layer and the iridium oxide layer may each have a thickness of about 10 nm or more and about 200 nm or less. In another example, each layer is about 100 nm thick or less, and in yet another example, each layer has a thickness of about 40 nm or less. Furthermore, in accordance with another exemplary aspect of the present invention, a total thickness of the bottom electrode layer is about 70 nm, wherein the iridium layer has a thickness of about 30 nm, and the iridium oxide layer has a thickness of about 40 nm.

Figure 16B:
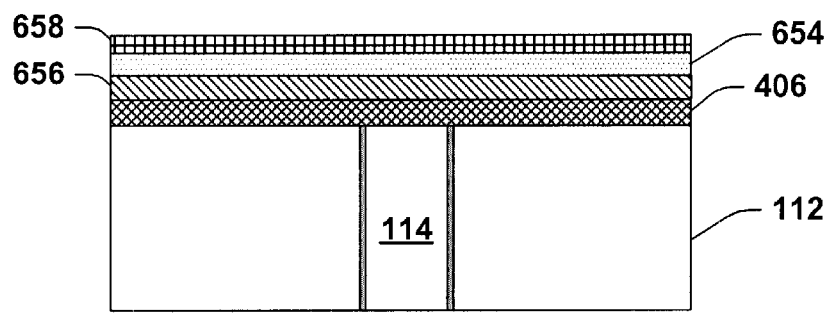

A titanium layer 658 is formed over the $IrO_2$ electrode layer 654 at 660 of FIG. 15, as illustrated in FIG. 16*b*. The titanium layer 658 is formed, for example, via sputtering at 660, however, any process used to deposit or otherwise form a titanium layer may be employed and is contemplated as falling within the scope of the present invention. For example, the titanium layer 658 may also be formed via chemical vapor deposition. According to one aspect of the present invention, the titanium layer has a thickness of about 10 nm or less. In another example, the titanium layer has a thickness of about 5 nm or less, and in yet another example, the titanium layer has a thickness of about 2 nm or less.

Figure 16C:
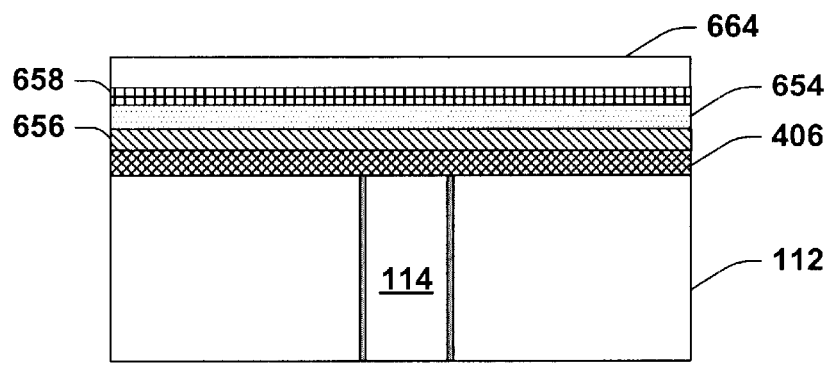
Figure 16D:
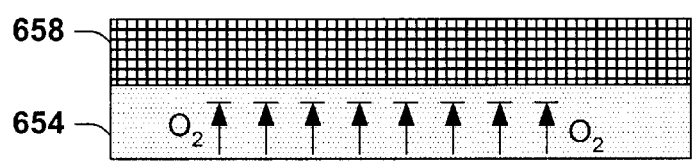

The method 650 continues at 662, wherein a ferroelectric dielectric layer 664 is formed over the titanium layer 658. More particularly, the ferroelectric layer 664 may comprise PZT, and a first phase of such formation is illustrated in FIG. 16*c*. As stated supra, the PZT processing conditions provide a reducing environment that tends to encourage a reduction of the underlying $IrO_2$ layer 654. According to one aspect of the present invention, the titanium layer 658 acts as a getting layer for oxygen as it attempts to diffuse out of the $IrO_2$ layer 654, as illustrated at 666 of FIG. 15 and 668 of FIG. 16*d*, which is an amplified view of the $IrO_2$ layer 654 and the titanium layer 658, respectively. Therefore the titanium layer 658 acts to retard the reduction of the $IrO_2$ layer 654 because oxygen diffusion therethrough is modestly slow compared to the diffusion through the $IrO_2$.

Figure 16E:
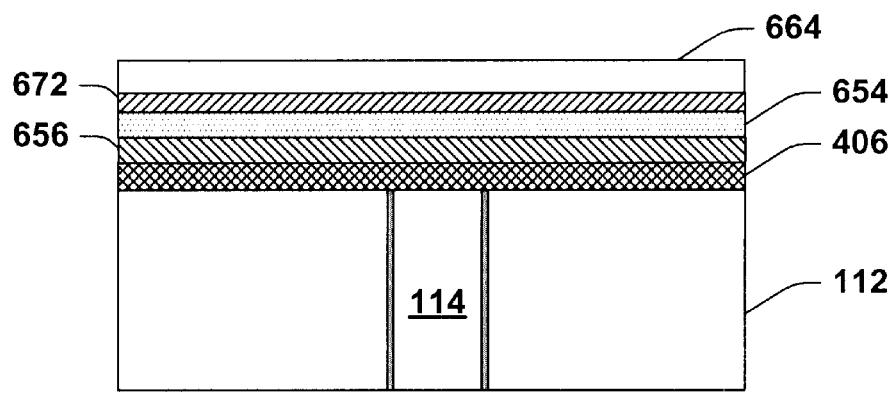
Figure 16F:
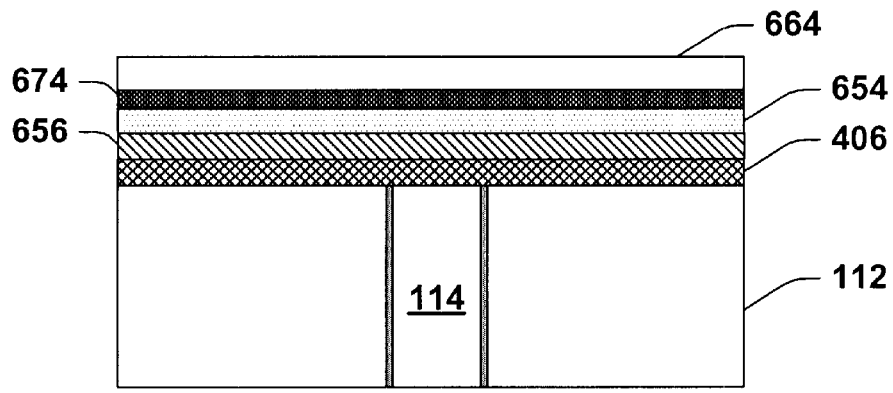
Figure 16G:
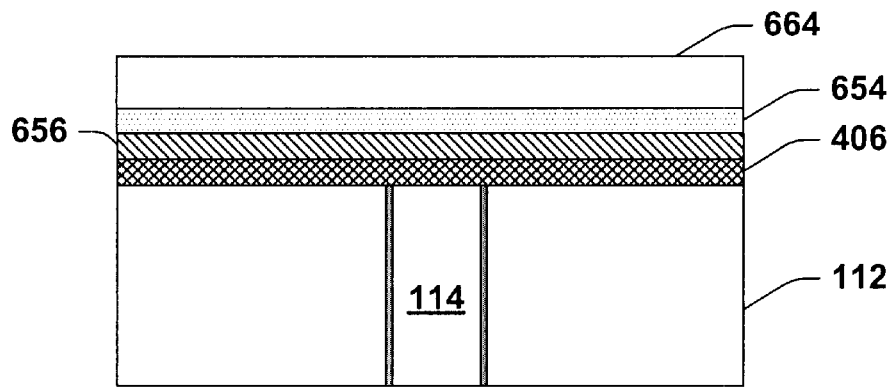

In addition to the above advantageous behavior of the titanium layer 658 retarding the reduction of the $IrO_2$ layer 654, the titanium layer 658 itself oxidizes during PZT formation at 670 of FIG. 15 to form titanium oxide ($TiO_2$) as illustrated in FIG. 16*e* at reference numeral 672. The titanium oxide 672 then reacts with the lead in the PZT material being deposited during a subsequent phase of PZT formation to form a lead titanate layer 674 which acts to form a high quality PZT film. The lead titanate 674 nucleates relatively easy and provides a good microstructure for a high quality PZT film (as illustrated in FIG. 16*f*) because the lead titanate has a large grain microstructure as compared to, for example, a lead zirconate which is substantially more refractory, and thus generates less PZT defects and promotes a good crystal orientation. As the PZT film formation continues, the zirconium from the PZT and the titanium oxide interdiffuse to form the PZT at 676, wherein the titanium oxide 658 effectively assimilates into the PZT film 664 such that after PZT formation, the PZT layer 664 overlies the $IrO_2$ layer 654, as illustrated in FIG. 16*g*.

In the above discussion, a titanium layer 658 was employed over the bottom electrode layer to retard a reduction of the iridium oxide. Alternatively, the titanium layer 658 may be replaced with a titanium oxide layer which would incorporate into the PZT during the subsequent processing. In yet another alternative aspect of the present invention, a zirconium or a zirconium oxide layer may be utilized in place of the titanium layer 658. In such case, the zirconium or zirconium oxide acts to retard the reduction of the iridium oxide and gets incorporated into the PZT during formation thereof.

In addition, use of a titanium layer, a titanium oxide layer, a zirconium layer or a zirconium oxide layer may also be employed in conjunction with each of the above or subsequently described methods of decreasing a reduction of the iridium oxide bottom electrode layer for improved FeRAM capacitor fatigue resistance.

According to still another aspect of the present invention, the bottom electrode layer is formed using an $Ir/IrO_2/Ir$ sandwich deposition prior to formation of the ferroelectric dielectric layer. Since oxygen diffusion through iridium is less than through the underlying iridium oxide, a reduction of the iridium oxide is reduced substantially compared to a formation of the ferroelectric dielectric directly over the $IrO_2$. In addition, any oxygen diffusion that does occur causes the iridium layer nearest the ferroelectric dielectric to become oxygen doped. The oxygen therein, in addition to the reducing ambient existing during the ferroelectric dielectric formation process, causes the oxygen doped iridium layer to oxidize during the later portion of the ferroelectric dielectric formation process, thus resulting in an $Ir/IrO_2$ bottom electrode with the ferroelectric dielectric thereover. In the above manner, a conductive oxide bottom electrode portion is provided that experiences less reduction than prior art formation methods, thereby resulting in an FeRAM capacitor exhibiting improved fatigue resistance.

Figure 17:
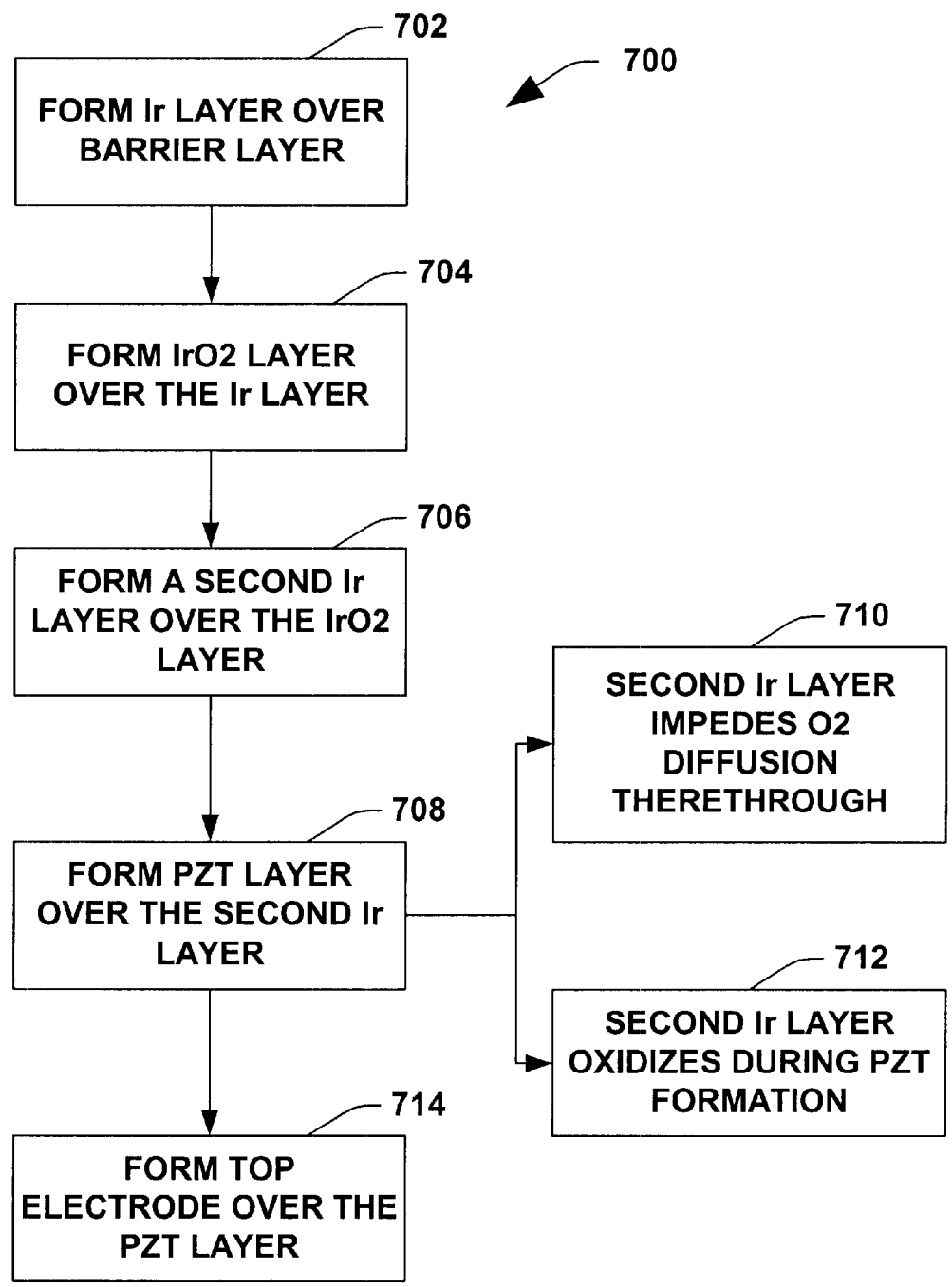
FIG. 17 is a flow chart diagram illustrating a method of forming an FeRAM capacitor having an iridium/iridium oxide/iridium layer sandwich as a bottom electrode according to the present invention.

A method by which the above functionality may be realized is illustrated in FIG. 17 and is designated at reference numeral 700. Initially, an iridium layer is formed over a barrier layer 406 which overlies the substrate at 702. As discussed previously, the iridium layer is a noble metal having a low resistivity which allows a good electrical contact to any electrical circuitry associated with the substrate. An iridium oxide layer is then formed over the iridium layer at 704. As discussed previously, the iridium oxide layer together with the underlying iridium layer forms the bottom electrode of the FeRAM capacitor, wherein the iridium oxide provides for improved fatigue resistance over other capacitors not employing a conductive oxide.

The method 700 then continues at 706 by forming another iridium layer over the iridium oxide layer. The second iridium layer overlying the $IrO_2$ layer will be employed to reduce an amount of oxygen diffusing out of the $IrO_2$ layer during the subsequent formation of the PZT layer. Any manner of forming the iridium and iridium oxide layers (for example, sputtering and reactive sputtering) may be employed and are contemplated as falling within the scope of the present invention.

In accordance with one exemplary aspect of the present invention, a total thickness of the iridium, iridium oxide and second iridium layer combination is less than about 200 nm.

Alternatively, the total thickness of the combination is less than about 100 nm, and preferably about 70 nm or less. In such an instance, the bottom iridium layer nearest the bottom electrode diffusion barrier is about 30 nm, the iridium oxide layer is about 30 nm, and the second iridium layer nearest the PZT layer is about 10 nm. Alternatively, each of the three layers in the combination may be varied between about 10–50 nm such that the total thickness remains about 70 nm.

The PZT layer is then formed at 708. Although a PZT layer is formed as the ferroelectric dielectric layer in the present example, any form of ferroelectric material which generates a reducing ambient during its formation is contemplated as falling within the scope of the present invention. As discussed previously, the formation of a PZT ferroelectric dielectric layer typically produces a reducing ambient which encourages disadvantageously the reduction of the underlying iridium oxide layer. According to the present invention, reduction of the iridium oxide layer is reduced substantially due to the presence of the second iridium layer overlying the iridium oxide layer. Because the iridium layer exhibits a substantially lower oxygen diffusion coefficient that iridium oxide, a diffusion of oxygen out of the iridium oxide layer during the formation of the PZT layer is reduced substantially.

Therefore during a first phase of the formation of the PZT layer, the iridium layer overlying the iridium oxide layer serves to retard a reduction of the iridium oxide layer at 710 of FIG. 17. Further, the oxygen that does diffuse out of the iridium oxide layer diffuses into the overlying iridium layer to form an oxygen doped iridium layer. Thereafter, during a second phase of the PZT layer formation, the oxygen within the oxygen doped iridium layer, along with the continuing reducing ambient, causes the iridium doped oxygen layer to oxidize to form an iridium oxide layer at 712. That layer, in conjunction with the underlying iridium oxide layer form the conductive oxide portion of the bottom electrode and improve the fatigue resistance of the FeRAM capacitor over prior art structures not having a conductive oxide electrode. The method 700 then concludes at 714 with the formation of the top electrode over the PZT layer. For example, the top electrode may comprise an iridium oxide layer and another iridium layer formed thereover, for example, via reactive sputtering and sputtering, respectively.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming an FeRAM capacitor, comprising:

forming an iridium layer comprising at least a portion of a bottom electrode layer over a substrate;

forming an oxygen doped iridium layer over the iridium layer;

forming a ferroelectric dielectric layer over the oxygen doped iridium layer; and forming a top electrode layer over the ferroelectric dielectric layer.

2. The method of claim 1, wherein the ferroelectric dielectric layer comprises PZT.

3. The method of claim 2, further comprising oxidizing the oxygen doped iridium layer at an interface of the oxygen doped iridium layer and the PZT layer during the formation of the PZT layer, thereby forming an iridium oxide layer underlying the PZT layer.

4. The method of claim 1, wherein the iridium layer and the oxygen doped iridium layer each have a thickness of about 10 nm or more and about 100 nm or less.

5. The method of claim 4, wherein the iridium layer has a thickness of about 30 nm, and the oxygen doped iridium layer has a thickness of about 40 nm.

6. A method of forming an FeRAM capacitor, comprising:

forming an iridium layer comprising at least a portion of a bottom electrode layer over a substrate;

forming an oxygen doped iridium layer over the iridium layer, wherein the oxygen doped iridium layer comprises a composition IrOx, wherein X is about 0.1 or more and about 1.5 or less;

forming a ferroelectric dielectric layer over the oxygen doped iridium layer; and forming a top electrode layer over the ferroelectric dielectric layer.

7. A method of forming an FeRAM capacitor, comprising:

forming an iridium layer comprising at least a portion of a bottom electrode layer over a substrate;

forming an oxygen doped iridium layer over the iridium layer;

forming a ferroelectric dielectric layer over the oxygen doped iridium layer, wherein forming the ferroelectric dielectric layer comprises forming PZT in a reducing environment, wherein a portion of oxygen within the oxygen doped iridium layer segregates at an interface of the oxygen doped iridium layer and the PZT layer, thereby reducing a portion of the oxygen doped iridium layer to assimilate with the underlying iridium layer and forming an iridium oxide layer overlying the iridium layer during the PZT layer formation; and forming a top electrode layer over the ferroelectric dielectric layer.

8. The method of claim 1, wherein forming the iridium layer comprises depositing iridium using a sputtering process.

9. The method of claim 1, wherein forming the oxygen doped iridium layer comprises depositing iridium in an Ar/O ambient, wherein a percentage of oxygen within the Ar/O ambient is sufficiently low to prevent a reaction of the oxygen with the iridium during deposition, thereby resulting in mono-dissolved oxygen present in a crystallographic single phase iridium layer.

10. The method of claim 9, wherein forming the oxygen doped iridium layer comprises depositing iridium in an Ar/O ambient containing about 10–30% oxygen.

11. The method of claim 1, wherein forming the oxygen doped iridium layer comprises:

depositing an iridium layer via sputtering; and implanting oxygen into the iridium layer via ion implantation.

12. A method of forming an FeRAM capacitor, comprising:

forming a bottom electrode layer over a substrate, wherein the bottom electrode layer comprises an iridium layer and an iridium oxide layer overlying the iridium layer, wherein the iridium oxide layer is formed by depositing an oxygen doped iridium layer, wherein oxygen within the oxygen doped iridium layer causes at least a portion thereof to oxidize with iridium therein during subsequent processing;

forming a PZT ferroelectric dielectric layer in a reducing ambient, wherein the reducing ambient causes oxygen and iridium within the underlying oxygen doped iridium layer to segregate at an interface between the oxygen doped iridium layer and the PZT ferroelectric dielectric layer and oxidize to form an iridium oxide layer between the iridium layer and the PZT layer; and forming a top electrode layer over the PZT ferroelectric dielectric layer.

13. The method of claim 12, wherein forming the top electrode layer comprises:

forming an iridium oxide layer over the PZT ferroelectric dielectric layer; and forming an iridium layer over the iridium oxide layer.

14. The method of claim 12, where forming the oxygen doped iridium layer further comprises depositing iridium via sputtering in an Ar/O ambient, wherein a percentage of oxygen within the Ar/O ambient is sufficiently low to prevent a reaction of the oxygen with the iridium during deposition, thereby resulting in mono-dissolved oxygen present in a crystallographic single phase iridium layer.

15. The method of claim 14, wherein forming the oxygen doped iridium layer comprises sputtering iridium in an Ar/O ambient containing about 10–30% oxygen.

16. The method of claim 12, wherein forming the oxygen doped iridium layer comprises:

depositing an iridium layer via sputtering; and implanting oxygen into the iridium layer via ion implantation.

17. The method of claim 12, wherein the iridium layer and the oxygen doped iridium layer each have a thickness of about 10 nm or more and about 100 nm or less.

18. The method of claim 17, wherein the iridium layer has a thickness of about 30 nm, and the oxygen doped iridium layer has a thickness of about 40 nm.

19. The method of claim 12, wherein the oxygen doped iridium layer comprises a composition IrOx, wherein X is about 0.1 or more and about 1.5 or less.

20. A method of forming an FeRAM capacitor, comprising:

forming an iridium layer via sputtering in an inert gas ambient;

forming an oxygen doped iridium layer over the iridium layer;

forming a PZT ferroelectric dielectric layer over the oxygen doped iridium layer, wherein the formation of the PZT layer to other subsequent processing causes the oxygen doped iridium layer to oxidize and form an iridium oxide layer disposed between the iridium layer and the PZT layer, and wherein the iridium layer and the iridium oxide layer together form a bottom electrode of the FeRAM capacitor; and forming a top electrode over the PZT layer.

21. The method of claim 20, wherein forming the top electrode layer comprises:

forming an iridium oxide layer over the PZT ferroelectric dielectric layer; and forming an iridium layer over the iridium oxide layer.

22. A method of forming an FeRAM capacitor, comprising:

forming an iridium layer via sputtering in an inert gas ambient;

forming an oxygen doped iridium layer over the iridium layer, wherein forming the oxygen doped iridium layer further comprises depositing iridium via sputtering in an Ar/O ambient, wherein a percentage of oxygen within the Ar/O ambient is sufficiently low to prevent a reaction of the oxygen with the iridium during deposition, thereby resulting in mono-dissolved oxygen present in a crystallographic single phase iridium layer;

forming a PZT ferroelectric dielectric layer over the oxygen doped iridium layer, wherein the formation of the PZT layer or other subsequent processing causes the oxygen doped iridium layer to oxidize and form an iridium oxide layer disposed between the iridium layer and the PZT layer, and wherein the iridium layer and the iridium oxide layer together form a bottom electrode of the FeRAM capacitor; and forming a top electrode over the PZT layer.

23. The method of claim 22, wherein forming the oxygen doped iridium layer comprises sputtering iridium in an Ar/O ambient containing about 10–30% oxygen.

24. The method of claim 20, wherein forming the oxygen doped iridium layer comprises:

depositing an iridium layer via sputtering; and implanting oxygen into the iridium layer via ion implantation.

* * * * *